United States Patent [19]
Imamura et al.

[11] Patent Number: 5,936,258
[45] Date of Patent: *Aug. 10, 1999

[54] OPTICAL SEMICONDUCTOR MEMORY DEVICE AND READ/WRITE METHOD THEREFOR

[75] Inventors: Kenichi Imamura, Kawasaki; Shun-ichi Muto, Sapporo; Naoto Horiguchi, Kawasaki; Yoshihiro Sugiyama, Kawasaki; Yoshiaki Nakata, Kawasaki, all of Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/632,153

[22] Filed: Apr. 15, 1996

[30] Foreign Application Priority Data

Apr. 28, 1995 [JP] Japan ................................ 7-105758
Dec. 26, 1995 [JP] Japan ................................ 7-339595

[51] Int. Cl.$^6$ .................... H01L 31/0304; H01L 31/10; H01L 31/105
[52] U.S. Cl. ................ 257/21; 257/17; 257/14; 257/30; 257/184
[58] Field of Search ................ 257/17, 21, 30, 257/14, 184

[56] References Cited

U.S. PATENT DOCUMENTS

| | | | |
|---|---|---|---|
| 5,187,715 | 2/1993 | Weisbuch | 257/17 |
| 5,436,468 | 7/1995 | Nakata | 257/14 |
| 5,440,148 | 8/1995 | Nomoto | 257/17 |
| 5,608,229 | 3/1997 | Mukai | 257/14 |

OTHER PUBLICATIONS

"Holographic Moving Picture Recording by Hole Burning", Mitsunaga et al, *Applied Physics*, vol. 64, No. 3, 1995, pp. 250–254, with English translation thereof.

"Direct Formation of Quantum–sized Dots from Uniform Coherent Islands of InGaAs on GaAs Surfaces", Leonard et al, *Appl. Phys. Lett.*, 63, (23), Dec. 6, 1993, pp. 3203–3205.

"Photoluminescence of Single InAs Quantum Dots Obtained by Self–Organized Growth on GaAs", Marzin et al, *Physical Review Letters*, vol. 73, No. 5, Aug. 1, 1994, pp. 716–719.

"Highly Uniform InGaAs/GaAs Quantum Dots (~15 nm) by Metalorganic Chemical Vapor Deposition", Oshinowo et al, *Appl. Phys. Lett.*, 65, (11), Sep. 12, 1994, pp. 1421–1423.

"Self–formed $In_{0.5}Ga_{0.5}$ as Quantum Dots on GaAs Substrates Emitting at 1.3$\mu$m", Mukai et al, *Jpn. J. Appl. Phys.*, vol. 33, Dec. 1, 1994, pp. L1710–L1712.

"Nanoscale InP Embedded in InGaP", Kurtenbach et al, *Appl. Phys. Lett.*, 66 (3), Jan. 16, 1995, pp. 361–363.

"On a Possibility of Wavelength–Domain–Multiplication Memory Using Quantum Boxes", *Jpn. J. Appl. Phys.*, vol. 34, Feb. 15, 1995, pp. L210–L212.

*Primary Examiner*—Jerome Jackson, Jr.
*Attorney, Agent, or Firm*—Nikaido, Marmelstein, Murray & Oram LLP

[57] ABSTRACT

A wavelength-domain-multiplication memory comprises a first semiconductor layer including a first conductivity type impurity, a carrier barrier semiconductor layer formed on the first semiconductor layer, and quantum dots formed in the carrier barrier semiconductor layer.

25 Claims, 30 Drawing Sheets

● --- electron
○ --- hole $R_0 : R_1$ : resistance

OPTICAL SEMICONDUCTOR MEMORY DEVICE AND READ/WRITE METHOD THEREFOR

BACKGROUND OF THE INVENTION

1. Field of the Invention

The present invention relates to an optical semiconductor memory device and a method for reading/writing from/into the optical semiconductor memory device. More specifically, the invention relates to an optical semiconductor memory device known as a wavelength-domain-multiplication memory utilizing quantum dots, and a method for reading/writing information from/into the optical semiconductor memory device.

2. Description of the Prior Art

With the enormous progress in information communication technology, it is highly desirable to build a system which makes it possible to make efficient use of respective features of an optical device and an electronic device.

Features of optical devices are higher speed processing and parallel processing, when compared to the electronic devices. Up to this time, various storage devices (memory devices) using optical devices have been proposed, but none have been embodied.

Considering a state of the art wherein peripheral logic circuits and/or switching circuits are consist of electronic devices, even if the memory cells are built by the optical devices, it would be important to make the best use of the benefits and features of respective electronic devices and optical devices. In existing technology, no clear device concept of optical memory has been provided.

To pursue a structure enabling the semiconductor to be a lower order of magnitude may lead to a quantum dot. Such quantum dot would be attractive in physical aspects since its state density is discrete in the quantum dot.

The quantum dots have been expected as optical memories since transition energy between ground levels in the quantum dots (quantum boxes) has extremely steep optical absorption spectra. Furthermore, it becomes feasible to read/write information by light irradiation if optical absorption saturation is strong.

In the event that shapes or sizes of the quantum dots are changed, absorption wavelength may be changed for every quantum dot. Therefore it becomes possible to store information in respective quantum dots by multiple wavelength light irradiation. Assuming that one-bit information can be stored in every quantum dot, one-bit information can be stored in a region of 10 nm ×10 nm and thus one-terabit information can be stored in a region of 1 $cm^2$.

Although satisfactory results have not been achieved due to the fact that quantum dots are difficult to form, several reports for forming the quantum dots have been offered in recent years.

For the purposes of example, if a quantum well structure can be fabricated by MBE method wherein plural-layered InGaAs layer having an In composition of about 0.5 and largely different lattice constants on a GaAs substrate, quantum dots of a 30 to 40 nm diameter could be formed. This has been reported in literature, such as D. Leonard et al., Appl. Phys. Lett. 63 (23), 1993, pp. 3203–3205.

Further, quantum dots of a 15 to 20 nm diameter could be formed at a distance of about 100 nm by atomic layer epitaxy (ALE) growth technique. This has been recited in literature, such as Kohki Mukai et al., Jan. J. Appl. Phys. Vol. 33 (1994), pp. L1710–L1712. The fact that similar quantum dots like the above could be obtained by MOVPE has been reported in literature, such as J. Oshinowo et al., Appl. Phys. Lett. 65 (11), 1994, pp. 1421–1423.

Furthermore, a structure has been reported by A. Kurtenbach et al., Appl. Phys. Lett. 66 (3), 1995, pp. 361–363, wherein InP quantum dots can be buried between InGaP layers by supplying InP on a first $In_xGa_{1-x}P$ (x=0.49) layer being grown on a GaAs substrate and then forming a second $In_xGa_{1-x}P$ (x=0.49) thereon.

It can be considered that the quantum dots formed as discussed above could be formed by positively causing distortion in crystal in growth process (Stranski-Krastanow mode).

One of requirements for the wavelength multiplication optical memory will be to achieve a wideband optical absorption material.

In the above-discussed literature, since the quantum dots can be formed in a self-organized fashion, they are subjected to thermal fluctuation, so that fluctuation in composition and fluctuation in size are caused. It would be understood that fluctuation in size is dominant in various fluctuation.

The magnitude of fluctuation in size of the quantum dots is such as 80 meV if represented by full-width at half maximum (FWHM) of photoluminescence. This is more than ten times as large as FWHM of two-dimensional quantum well layer. The wavelength multiplication optical memory may be characterized by utilizing this fluctuation positively.

However, it will be limited to increase FWHM by using this fluctuation, and it is impossible to increase FWHM more than 100 meV.

A structure and operation of the wavelength multiplication optical memory will be as follows.

As shown in FIGS. 1A and 1B, in the wavelength-domain-multiplication memory, a buffer layer 202 formed of AlGaAs may be formed on a (001) face of a GaAs substrate 201, and a plurality of quantum dots 204 formed of InGaAs put between two barrier layers 203, 205 formed of GaAs may be formed thereon. If the quantum dots 204 are formed of InP, two barrier layers 203, 205 are formed of GaAs and the buffer layer 202 are formed of GaAs.

In a wavelength-domain-multiplication memory having this structure, if the light of specific wavelength is irradiated, the hole-electron pairs are created by photo-excitation in the quantum dots 204, as shown in FIG. 1C. Since the electrons have high tunneling probability and X point band energy of AlAs is low, the electrons can pass through the AlGaAs barrier to move to exterior of the quantum dots. Transition of the electrons may be detected as a change in the current.

If electric field E is applied in the film thickness direction upon light irradiation, the electrons may flow from the quantum dots 204 because of tunneling, etc. and move in the electric field E; therefore, transition of the electrons may be measured as change in the current. Conversely, since holes cannot pass through the barrier due to a large effective mass, they stay in the quantum dots 204. As a result, information "1" has been written, for example, in the quantum dots 204.

Moreover, if the light of a specific wavelength is irradiated to the quantum dots 204 to read information, the electrons do not flow out of the quantum dots 204, since only the holes reside in the quantum dots 204. Consequently, a change in the current does not occur, and in that case data "1" has been read out.

On the other hand, it can be regarded as writing of information "0" not to create the hole-electron pairs in the quantum dots 204 without initial light irradiation to the quantum dots 204. Then, if the light of specific wavelength is irradiated to read information while applying electric field in the film thickness direction, the hole-electron pairs are created by photo-excitation in the quantum dots 204, which can be measured as change in the current. In this event, data "0" has been read out.

The wavelength-domain-multiplication memory is such a storage device that plural kinds of quantum dots having different reading/writing wavelengths are provided. For example, the wavelength-domain-multiplication memory has been discussed, for example, by Shunichi Muto, Jan J. Appl. Phys. Vol. 34 (1995), pp. L210–L212.

The wavelength-domain-multiplication memory disclosed in this literature comprises an AlAs substrate having an inclined principal face and a group III-IV semiconductor layer. On the principal face of the AlAs substrate, steps are formed in two directions according to the inclination. GaAs's are formed at the corners of the steps, and an AlGaAs layers are formed around the corners. Thus GaAs's surrounded by the AlGaAs layers may serve as the quantum dots (quantum boxes).

Conversely, since the holes are difficult to flow out of the quantum dots, the holes remain in the quantum dots. Under this condition, even if the lights having the same wavelength are irradiated to the quantum dots, light absorption is seldom caused since the quantum dots occur strong absorption saturation due to remaining holes.

It would be feasible to read/write information from or into the quantum dots by using such a phenomenon. If plural quantum dots having different sizes and shapes were utilized, different reading/writing wavelengths may be employed quantum dot by quantum dot, so that a significant amount of information can be stored by multiple wavelengths. Thus, the wavelength multiplication memory has been accomplished.

However, since there is a high probability that the electrons being emitted from the quantum dots may return to the quantum dots to recombine with the holes therein, a retaining time of this wavelength multiplication memory is reduced, such as 1 to 10 ms. Since it is mandatory to detect by optical absorption whether or not absorption saturation appears in the quantum dots, a practical structure of the memory has not yet been taught.

SUMMARY OF THE INVENTION

An object of the present invention is to provide an optical semiconductor memory device capable of preventing loss of memory information.

Another object of the present invention is to provide an optical semiconductor memory device capable of prolonging a record retaining time and being practical and effective in use, and a write/read method for use in the optical semiconductor memory device.

According to an aspect of the present invention, a semiconductor layer including a plurality of quantum dots may be disposed between a first and second conductive films. Hole burning is caused in the quantum dots by applying an electric field between the conductive films, and as a result electrons emitted from the quantum dots are made difficult to return to the quantum dots.

According to another aspect of the present invention, a wavelength multiplication memory may be formed by forming a carrier barrier semiconductor layer including quantum dots therein on a semiconductor layer containing first conductivity type impurity. Therefore, when hole burning is caused by light irradiation, the possibility is increased that electrons being emitted from the quantum dots flow into the first conductivity type impurity containing semiconductor layer while the possibility is decreased that recombination occurs due to carriers flowing to the quantum dots.

Information may be written into the quantum dots by either causing hole burning by light irradiation to the quantum dots, or by preventing hole burning with no light irradiation. For instance, data "1" may be written if hole burning is caused, and data "0" may be written if hole burning is not caused.

Written information may be read by irradiating the light of the same wavelength. Depending upon a change in the current flowing through the semiconductor layer due to light irradiation or change in quantity of optical absorption, "1" or "0" may be decided.

When a data "0" has been written into the quantum dots, since hole-electron pairs are created in the quantum dots by the reading light, either light absorption may appear in the quantum dots or electrons may flow out of the quantum dots. Thereby, it may be decided that data "0" has been written in the quantum dots.

When the electrons are emitted from the quantum dots by light irradiation, the first conductivity type impurity containing semiconductor layer may be separated with respect to energy from quantum levels of the quantum dots by forming the above first conductivity type impurity containing semiconductor layer as an n type semiconductor layer.

Therefore, the electrons may have difficulty in returning to the quantum dots because of diffusion potential.

When a data "1" has been written into the quantum dots, since the hole-electron pairs are created by reading light in the quantum dots, optical absorption cannot be caused by the quantum dots, and also the electrons cannot move out of the quantum dots.

The lights used for reading/writing information are restricted to wavelengths corresponding to energy difference in ground levels between the conduction band and the valence band of the quantum dots. For this reason, since wavelengths of the reading/writing lights become different by differentiating sizes of the quantum dots, the bit number of memory devices may be determined according to the number of size differences of the quantum dots.

Initialization of information may be effected by injecting the electrons into the quantum dots. For example, initialization may be done by applying an electric field to the semiconductor layer around the quantum dots, or by irradiating the light to the quantum dots.

In order to prevent destruction of information, when saving information or reading information, a bias voltage may be applied to the impurity containing semiconductor layer around the quantum dots so as to thicker the energy barrier around the quantum dots.

If the semiconductor layer including the quantum dots is adopted as part of the active device such as photodiode, bipolar transistor, field effect transistor, etc., an effective optical semiconductor memory device may be accomplished. By adopting the active device as the basic structure, the reading current may be amplified or quantity of light may be converted into electric signals, thus facilitating reading of information.

When sizes of plural quantum dots formed in the film thickness direction are different, information may be written serially by changing optical energy sequentially, or information may be written simultaneously (in parallel) by mixing plural optical energy having different magnitudes. If the lights are irradiated to the quantum dots while changing their energy, to prevent the destruction of written information, it would be desired that information is written in the order of carrier drift direction.

When sizes of plural quantum dots formed in the film thickness direction are different, it would be preferable to read information by changing optical energy serially. However, to prevent destruction of information yet read in the quantum dots, it would be desired that information are written in the opposite order of carrier drift direction.

According to still another aspect of the present invention, an energy barrier layer may be formed in a semiconductor layer surrounding quantum dots on the opposite side to carrier (electron or hole) drift direction. For this reason, erroneous recombination of electrons or holes would be prevented in the quantum dots from which electrons or holes are released, so that there is no possibility that data is lost.

In this event, if a low potential compound semiconductor layer having low potential energy may be formed adjacent to the energy barrier layer, the carriers transition is blocked by the energy barrier layer and they can move along the compound semiconductor layer, so that they can be effectively collected.

When the carriers have drifted from the quantum dots on the upper side, they cannot enter into the quantum dots on the lower side because transition of such carriers may be prevented by the energy barrier layer. Therefore, undesirable crosstalk between the quantum dots being located in individual layers can be prevented.

When an electric field is applied in a face direction (a direction perpendicular to the film thickness direction) of the energy barrier layer or the low potential semiconductor layer, the carriers being drifted from upper quantum dots by irradiating a reading light are drifted in the electric field. Therefore, if the drift of the carriers is detected as a current, data in the upper quantum dots can be read.

It should be noted that the upper quantum dots and the lower quantum dots may have either the same transition energy or different transition energy.

DESCRIPTION OF THE PREFERRED EMBODIMENT

There will be now described preferred embodiments of the present invention with reference to accompanying drawings.

An optical semiconductor memory device according to a first embodiment of the present invention will be explained with reference to FIGS. 2A to 2C. A semiconductor in group III-V described later can be grown by means of an MBE apparatus, for example.

First, an n type GaAs substrate 1 which has a lightly slanted face from a (111) face as a principal face may be prepared. As shown in FIG. 2A, an n type GaAs layer 2 having an impurity concentration of $1 \times 10^{18}$ atoms/cm$^3$ is formed to have a thickness of 50 nm on the principal face of the n type GaAs substrate 1, and an undoped Al$_{0.5}$Ga$_{0.5}$As layer 3 of 25 nm thickness is formed on the n type GaAs layer 2. In turn, an InAs layer 4 is formed on the Al$_{0.5}$Ga$_{0.5}$As layer 3 to have a thickness of several atomic layers (referred to as "ML" hereinafter).

Figure 1A:
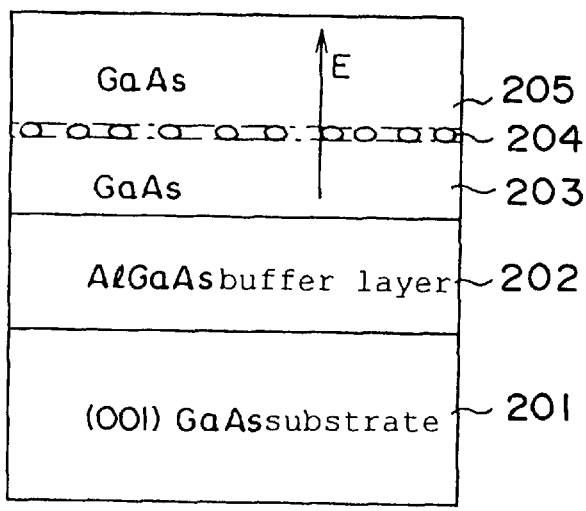
FIG. 1A is a sectional view showing an example of a conventional optical semiconductor memory device having quantum dots.
Figure 1B:
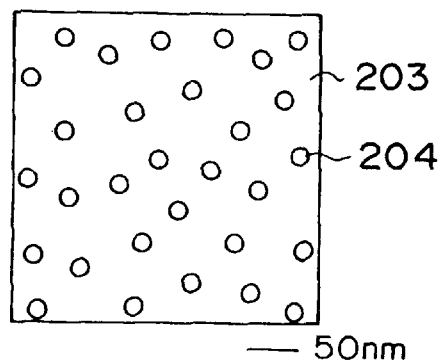
FIG. 1B is a plan view showing a TEM image of a layer in which quantum dots of the optical semiconductor memory device in FIG. 1A are formed.
Figure 1C:
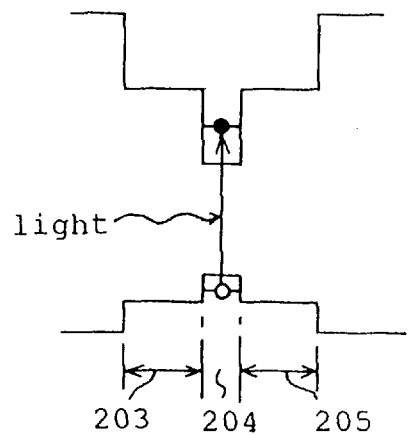
FIG. 1C is a view showing an energy band structure of a quantum dot and neighboring semiconductor layer in FIG. 1A.
Figure 2A:
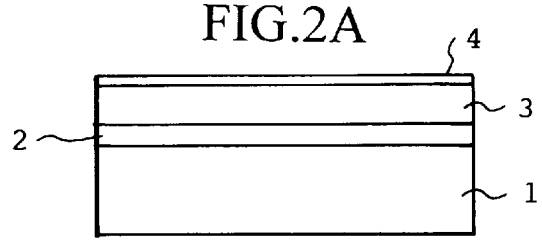
FIGS. 2A to 2D are sectional views for showing a fabricating method of an optical semiconductor memory device according to a first embodiment of the present invention.
Figure 2B:
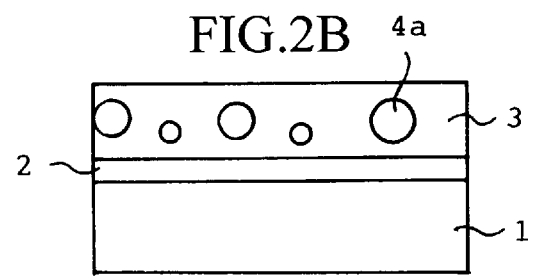

Subsequently, as shown in FIG. 2B, the undoped Al$_{0.5}$Ga$_{0.5}$As layer 3 of 25 nm thickness may be again grown to include the InAs layer 4 therein. After the Al$_{0.5}$Ga$_{0.5}$As layer 3 have been formed for the second time, the InAs layer 4 may be changed to droplet-like shapes because of difference in lattice constants between the InAs layer 4 and the InAs layer 4. In other words, the droplet-like InAs layer 4 may serve as a quantum dot (quantum box) 4a. The higher the growth temperature, the larger the diameter of the quantum dot 4a. For instance, an average size of the quantum dot 4a is 15 nm at 450° C. In addition, there are a plurality of the quantum dot 4a having the same size.

Figure 3:
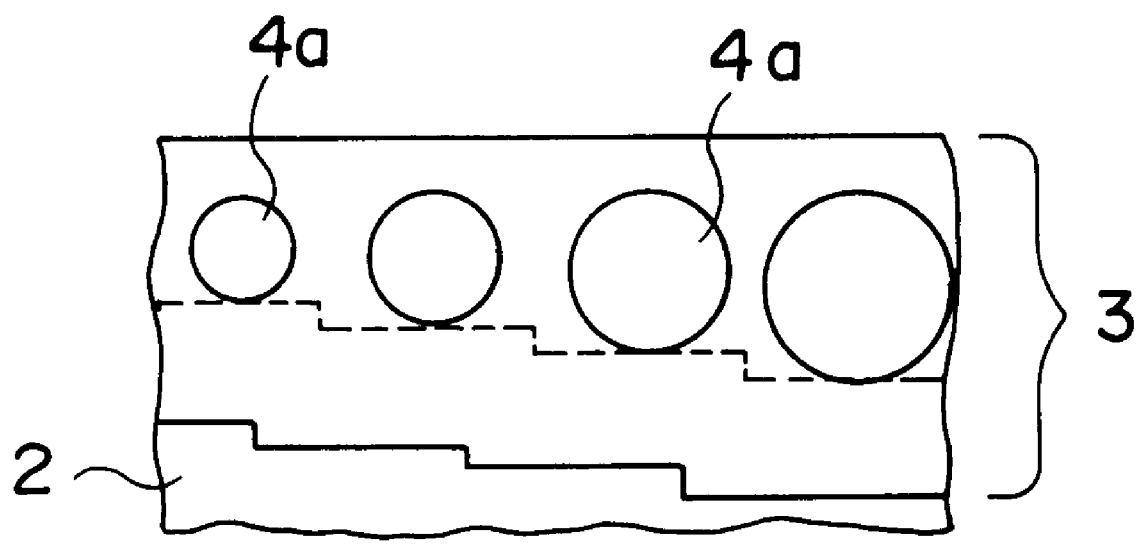
FIG. 3 is a sectional view showing quantum dots each having a different size, used in the first embodiment of the present invention.

If the quantum dots 4a have been formed on the face which is slanted by several degrees from the (111) face, a plurality of the quantum dots 4a with different size may be formed every crystal stage caused on the slant, as shown in FIG. 3, by adjusting growth conditions of the InAs layer 4 serving as the quantum dots 4a. In principle, different sizes and shapes of the quantum dots 4a may cause different potential well widths of the quantum dots 4a, so that optical energy (wavelength) to create electron-hole pairs due to optical absorption in the quantum dots 4a may be differentiated.

Figure 2C:
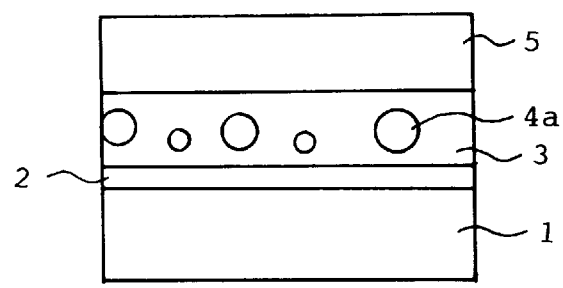

As shown in FIG. 2C, a p type $Al_{0.5}Ga_{0.5}As$ layer 5 of 200 nm thickness may be grown on the undoped $Al_{0.5}Ga_{0.5}As$ layer 3. An impurity concentration of the p type $Al_{0.5}Ga_{0.5}As$ layer 5 is $1\times10^{18}$ atoms/cm$^3$. The p type $Al_{0.5}Ga_{0.5}As$ layer 5 may serve as a carrier barrier layer.

Formation of the quantum dots has been disclosed, for example, in J. Y. Marchin et al., entitled "Photoluminescence of Single InAS Quantum Dots Obtained by Self-Organized Growth on GaAs", Physical Review Letters Vol. 73, No. 5 1994, pp. 716–719. Dot size and shape can be controlled by growth temperature, a molar ratio of In and As, and so forth.

Figure 2D:
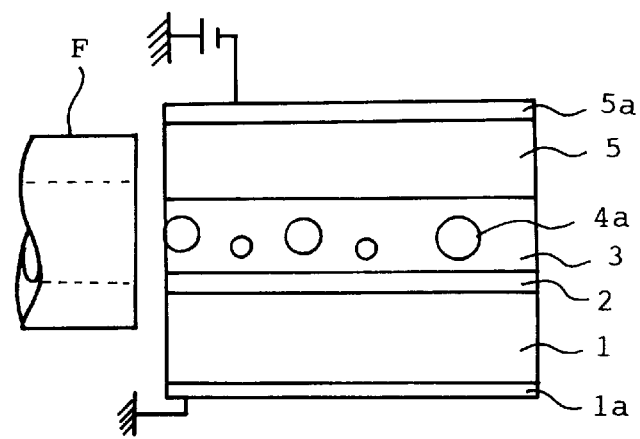

As shown in FIG. 2D, an n side electrode 1a may be formed on a bottom surface of the n type GaAs substrate 1 whereas a p side electrode 5a may be formed on the p type $Al_{0.5}Ga_{0.5}As$ layer 5.

With the above, a basic configuration of the optical semiconductor memory device may be completed.

Figure 4A:
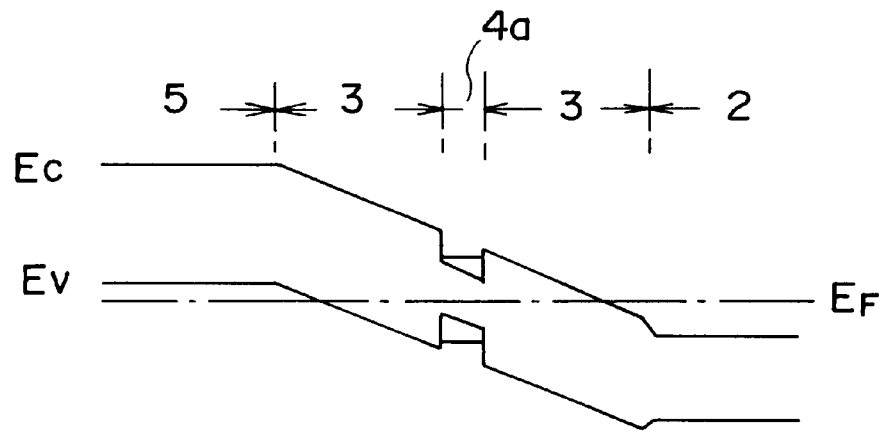
FIGS. 4A to 4C are energy band diagrams of the optical semiconductor memory device according to the first embodiment of the present invention.

FIG. 4A shows an energy band structure of one quantum dot 4a and the semiconductor layer around the quantum dot 4a.

Figure 4B:
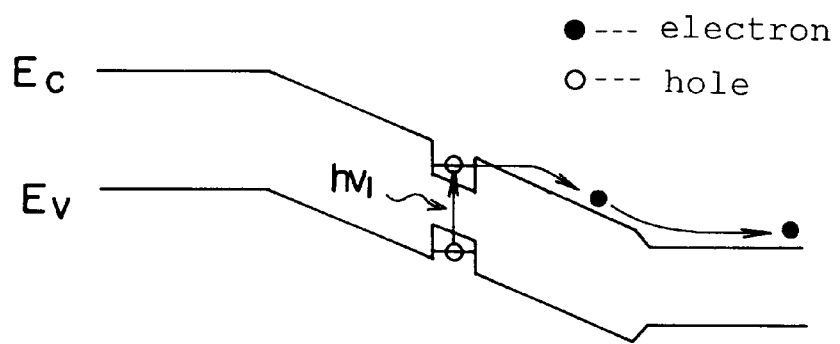

In the event that a light is irradiated to the quantum dots 4a, electrons may be moved from the valence band (Ev) to the conduction band (Ec), as shown in FIG. 4B, to thus create the electron-hole pairs. Energy (wavelength) hv of the light is assumed to have the same order of magnitude as energy (referred to as "separation energy" hereinafter) between ground levels of the valence band and the conduction band. The electron-hole pairs cannot be created even if a light having different energy than the separation energy has been irradiated. The light serving to create the electron-hole pairs may be absorbed not to transmit the quantum dots 4a.

Meanwhile, in the energy band diagram, since the undoped $Al_{0.5}Ga_{0.5}As$ layer 3 inclines because of diffusion potential between the n type GaAs layer 2 and the p type $Al_{0.5}Ga_{0.5}As$ layer 5, energy barrier of the undoped $Al_{0.5}Ga_{0.5}As$ layer 3 would be thinned against the quantum dots 4a. As a result, electrons which have been transferred to the ground level of the conduction band of the quantum dots 4a may move to the n type GaAs layer 2 through the undoped $Al_{0.5}Ga_{0.5}As$ layer 3.

The conduction band of the n type GaAs layer 2 may be spatially separated from the conduction band of the quantum dots 4a via the undoped $Al_{0.5}Ga_{0.5}As$ layer 3. The bandgap of the n type GaAs layer 2 is smaller than that of the undoped $Al_{0.5}Ga_{0.5}As$ layer 3, and energy difference between them is large. This leads to the fact that quantum level of the conduction band of the quantum dots 4a can be separated from the GaAs layer 2 in respect of energy.

Accordingly, probability that electrons coming to the n type GaAs layer 2 will return to the quantum dot 4a via the $Al_{0.5}Ga_{0.5}As$ layer 3, i.e., probability of recombination, may be extremely lessened.

For purposes of example, if energy difference between the conduction band or Fermi level EF of the n type GaAs layer 2 and ground level of the conduction band of the quantum dots 4a is about 0.6 eV, hole retaining time in the quantum dot 4a may be more than 1000 hours, which is longer than that which was previously known. Therefore, operation may be enabled at room temperature.

Figure 4C:
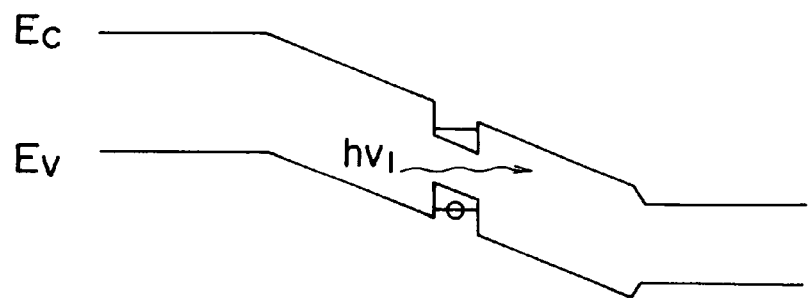

Consequently, as shown in FIG. 4C, holes may be confined in ground level of the valence band of the quantum dots 4a.

In this fashion, such a phenomenon has been called in general as "hole burning" that electrons having been transferred to the ground level of the conduction band of the quantum dots 4a may move to the exterior through energy barrier. As a result, only holes remain in the valence band of the quantum dots 4a.

Information reading/writing in the optical semiconductor memory device having the structure as above mentioned will be explained below.

The light being used for reading/writing information is irradiated from an optical fiber F.

When a data "0" would first be written, the optical semiconductor memory device may be set in an energy band state, as shown in FIG. 4A, without irradiation of the light.

Conversely, in case data "1" would be written, the light having energy corresponding to separation energy of the quantum dot 4a may be irradiated to the quantum dots 4a. This results in hole burning in the quantum dot 4a, as shown in FIG. 4C. Thereby data "1" has been written in the device.

It would be understood that probability may be significantly lessened wherein electrons, which have already moved to the conduction band of the n type GaAs layer 2 in compliance with the writing operation of data "1", can return to the quantum dots 4a, which are separated spatially and energetically from each other, to be recombined there. Therefore, a data "1" cannot be eliminated.

The following describes the case where data is read.

First, a backward bias voltage may be applied between the n side electrode 1a and the p side electrode 5a.

Then, when reading data being written, the light having the same energy as separation energy of the quantum dots 4a may be irradiated to the quantum dots 4a.

If data "1" has been written, transition of electrons from the quantum dots 4a to the n type GaAs layer 2 are not caused, as shown in FIG. 4C. No change can therefore be seen in current flowing through a monitor M connected between the n side electrode 1a and the p side electrode 5a. As a result, irradiated light may be transmitted through the quantum dots 4a.

On the contrary, if a data "0" has been written, hole burning is caused by light irradiation in the quantum dots 4a, as shown in FIG. 4B, and therefore electrons may move to the n type GaAs layer 2 to flow current through the monitor M. In this event, detection sensitivity may be enhanced since an amount of electron can be increased if a plenty of quantum dots with the same size have been formed preliminarily. It should be noted that detection sensitivity may also be enhanced if an n– type GaAs layer is interposed between the n type GaAs layer 2 and the undoped $Al_{0.5}Ga_{0.5}As$ layer 3 and then high electric field is applied there to cause avalanche breakdown easily.

As stated earlier, stored information may be read by flowing current, but since continuous reading cannot be executed for several times, memory refresh is needed after the reading operation. More particularly, if hole burning has been caused due to reading of data "0", carriers must be injected into the quantum dots 4a by applying a positive bias voltage between the n type GaAs layer 2 and the p type $Al_{0.5}Ga_{0.5}As$ layer 5 to generate recombination, i.e., to erase information. Then, a rewriting operation must be effected.

In any event, separation energy of the quantum dots 4a becomes different depending upon diameter size of the quantum dots 4a and growth temperature of the InAs layer 4. It would be evident that, if hole burning is caused by irradiating a plurality of lights having different wavelengths to the memory device, a plurality of quantum dots 4a having different diameter permits plural information to be read/write simultaneously.

The number of groups of the quantum dots 4a being classified according to diameter differences may therefore correspond to the bit number of the optical memory device.

It is preferable that, in case information are read by the lights having different wavelengths, quantity of light with particular wavelength irradiated to the quantum dots 4a upon reading would be less than that irradiated to the quantum dots 4a upon writing. This is because hole burning may be caused in part of a plurality of quantum dots of the same diameter by reducing quantity of light when data "0" is read. Accordingly, there can be reduced the case where information are destroyed since electrons emitted by means of hole burning enter into the quantum dots having other diameter, thus the number of refresh operations can either decreased or eliminated.

Two electrons may be emitted from one quantum dot, but for easy understanding only one electron is illustrated in the drawings.

As a second embodiment, a method for reading data, which being stored in the optical semiconductor memory device discussed in the first embodiment, depending on change in optical absorption factor will be explained hereinafter.

When written data are read, light having the same energy as separation energy of the quantum dots 4a may be irradiated to the quantum dots 4a.

FIG. 4A illustrates energy band under condition where a data "0" has been written. Under this condition, if the light is irradiated to the quantum dots 4a, hole-electron pairs are created as shown in FIG. 4B. Since the irradiated light may be absorbed in the quantum dots 4a, optical absorption factor is small. In case, as above, absorption factor of the light is noticeable in particular wavelength, it may be determined that data "0" has been written.

Conversely, FIG. 4C illustrates an energy band where a data "1" has been written. Under this condition, if the light is irradiated to the quantum dots 4a, hole-electron pairs are not created because holes are present in the valence band of the quantum dots 4a. Therefore, optical absorption factor in the quantum dots 4a become large. Like the above, in case absorption factor of the light irradiated to the quantum dots 4a is small, it may be determined that data "1" has been written.

In this instance, since information cannot be monitored by output current but by a change in optical absorption factor, transition of electrons from the quantum dots 4a to the n type GaAs layer 2 is not needed at the time of reading of a data "0".

In this event, it can be seen that, in order to reduce the number of times of information refresh, generation of tunnel must be rendered difficult at the time of reading data. To generate a tunnel in the barrier at writing data, as shown in FIG. 4B, and to make generation of tunnel difficult in the barrier at reading data, following method may be considered.

When writing information, it should be requested that electrons can drift readily from the quantum dots 4a to the outside of the undoped $Al_{0.5}Ga_{0.5}As$ layer 3. For this reason, it is preferable to apply the backward bias voltage between the n type GaAs layer 2 and the p type $Al_{0.5}Ga_{0.5}As$ layer 5.

Figure 5A:
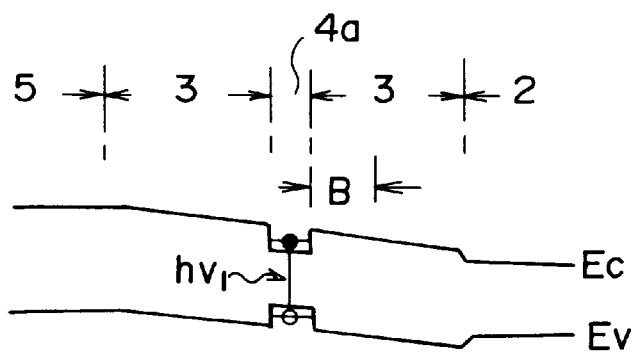
FIGS. 5A and 5B are energy band diagrams of an optical semiconductor memory device according to a second embodiment of the present invention when information are hold or read.
Figure 5B:
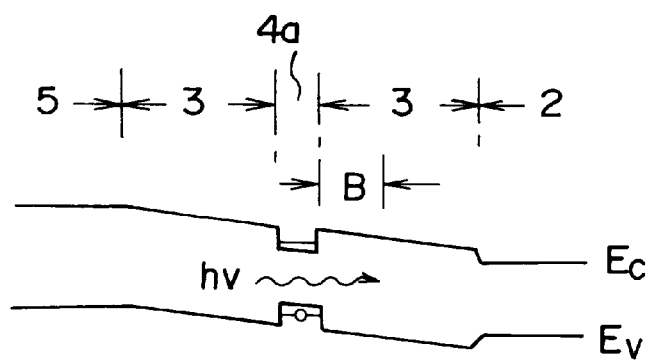

While, when reading stored information or retaining information, the light may be irradiated either without applying the backward bias voltage between the n type GaAs layer 2 and the p type $Al_{0.5}Ga_{0.5}As$ layer 5, or with applying the forward bias therebetween. More particularly, when reading information, as shown in FIGS. 5A and 5B, the slant of the undoped $Al_{0.5}Ga_{0.5}As$ layer 3 serves as the barrier is lessened to make barrier B substantially thick. In a state where data "0" has been written, the electron-hole pairs are created by light irradiation as shown in FIG. 5A, but electrons cannot pass though the barrier B and can thus instantaneously recombine with holes. Therefore, stored information cannot be destroyed. Of course, when a data "1" has been written, the electron-hole pairs are not created by light irradiation as shown in FIG. 5B. Therefore, there is no possibility that data are eliminated.

At the time of retaining data, if either the backward bias voltage is not applied between the n type GaAs layer 2 and the p type $Al_{0.5}Ga_{0.5}As$ layer 5, or the forward bias is applied therebetween, the barrier B may be made sufficiently thick to prevent data from being eliminated.

Figure 6:
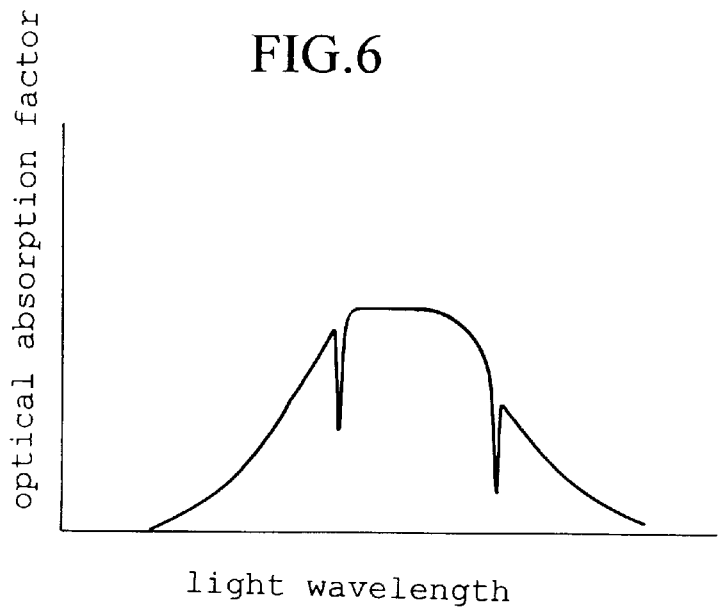
FIG. 6 is a schematic view showing a relationship between light wavelength and optical absorption factor of the quantum dots in the optical semiconductor memory device according to the second embodiment of the present invention when information are read.

When information is read from the memory device in which a plurality of quantum dots 4a having different diameters are formed, a relationship between light wavelength and optical absorption spectrum, as shown in FIG. 6, for example, will be examined. It can be understood that, if separation energy of the quantum dots 4a corresponds to the wavelength having less optical absorption factor, data "1" has been written in such quantum dots 4a.

In an optical semiconductor memory device according to a third embodiment of the present invention, in FIG. 2A, transparent conductive layers (not shown) which may be ohmic-contacted to the undoped $Al_{0.5}Ga_{0.5}As$ layer 3 including the quantum dots 4a therein may be formed with the undoped $Al_5Ga_{0.5}As$ layer 3 therebetween. By way of example, a transparent electrode formed of ITO may be formed in place of at least one of the n type GaAs layer 2 and the p type $Al_{0.5}Ga_{0.5}As$ layer 5.

Figure 7A:
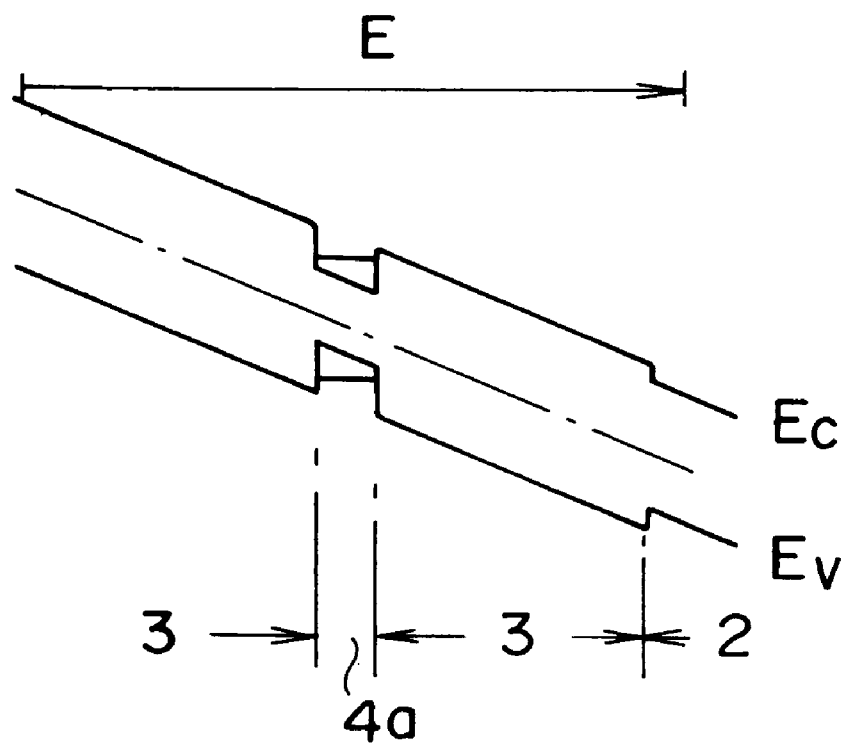
FIGS. 7A and 7B are energy band diagrams of an optical semiconductor memory device according to a third embodiment of the present invention.
Figure 7B:
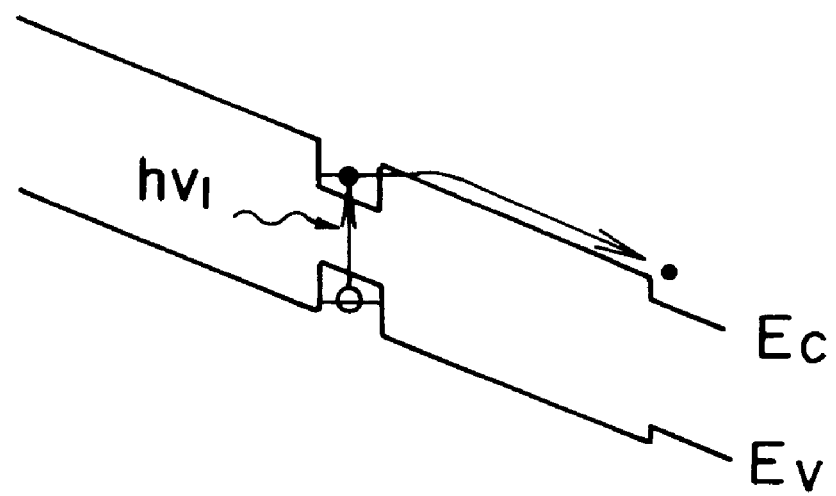

In the memory device having this configuration, if electric field is applied in the lateral direction of the undoped $Al_{0.5}Ga_{0.5}As$ layer 3 around the quantum dots 4a, energy band can be derived, as shown in FIG. 7A. If the light having energy hv1 being identical to separation energy of the quantum dots 4a is irradiated to the quantum dots 4a, hole burning is caused as shown in FIG. 7B. Thus, a data "1" can be written.

In case data "0" will be written, not to irradiate the light to the quantum dots 4a may be selected.

As for the method for reading stored information, its explanation may be omitted since it is identical to those in the first and second embodiments.

Figure 8:
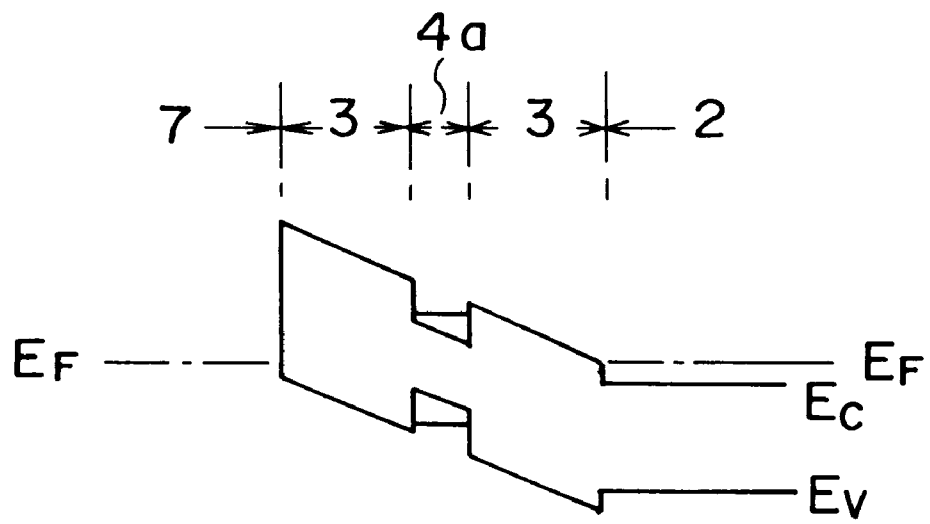
FIG. 8 is an energy band diagram of an optical semiconductor memory device having a Schottky barrier according to a fourth embodiment of the present invention.

In an optical semiconductor memory device according to the fourth embodiment of the present invention, a metal layer formed of WSi may be formed to have a thickness of 200 nm, for example, instead of the p type $Al_{0.5}Ga_{0.5}As$ layer 5 in the memory device according to the first embodiment, so that a Schottky barrier may be formed on the junction portion between the undoped $Al_{0.5}Ga_{0.5}As$ layer 3 and the metal layer. An energy band is formed as shown in FIG. 8. It can be understood that the Schottky barrier has been formed between the undoped $Al_{0.5}Ga_{0.5}As$ layer 3 and the metal layer 6.

Since the height of the Schottky barrier is about 0.7 eV against the n– GaAs, potential difference between the n type GaAs layer 2 and the Schottky barrier may be enhanced, and as a result it may become hard for electrons to return to the quantum dots 4a. Therefore, information retaining time may be prolonged compared to that of the first embodiment.

Figure 9:
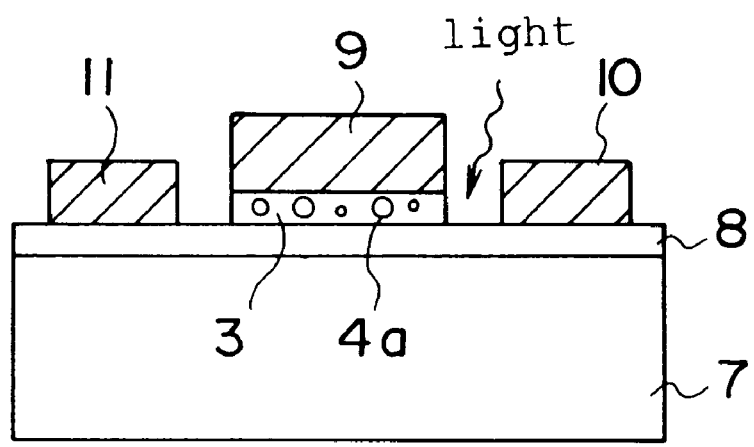
FIG. 9 is a sectional view showing a structure of the optical semiconductor memory device according to the fourth embodiment of the present invention.

An example of the optical semiconductor memory device having the Schottky barrier is shown in FIG. 9.

In this example, an n type GaAs layer 8 of impurity concentration of $5 \times 10^{17}$ atoms/cm$^3$ may be formed to have a 50 nm thickness on a semiconductor insulating substrate 7. The undoped Al$_{0.5}$Ga$_{0.5}$As layer 3 including a plurality of the quantum dots 4a which are formed of InAs and have different diameters may then be formed to have a 50 nm thickness on the layer 8. Further, a gate electrode 9 formed of WSi may be formed to have a 200 nm thickness on the layer 3. At this time, the Schottky barrier may be generated on the junction portion of the gate electrode 9 and the undoped Al$_{0.5}$Ga$_{0.5}$As layer 3.

A source electrode 10 and a drain electrode 11 being formed on both sides of the gate electrode 9 at a distance may be resistance-connected. The source electrode 10 and the drain electrode 11 can be formed by two metal layers consisting of AuGe of 20 nm thickness and Au of 200 nm thickness.

In this semiconductor memory device, information can be written by irradiating the light to the undoped Al$_{0.5}$Ga$_{0.5}$As layer 3 from the lateral direction.

In the case of information reading, data "1" or "0" may be determined depending upon the magnitude of source/drain current by applying a negative reading voltage to the gate electrode 9 and simultaneously applying voltage between the source electrode 10 and the drain electrode 11. If hole burning has occurred in the quantum dots 4a, i.e., if data "1" has been written in the quantum dots 4a, spreading of the depletion layer from the gate electrode 9 can be prevented because of holes. Therefore, drain current can be increased rather than the state data "0" has been written, so that data "1" may be read.

As another method for reading information, under the condition where source/drain current is flown by applying voltage to the gate electrode 9, change of source/drain current may be examined while irradiating the light of particular wavelength and not irradiating the light. In this event, if drain current may be increased by irradiating the light of particular wavelength, it can be seen that data "0" has been written since hole burning is caused due to transition of electrons from the quantum dots 4a to the channel region.

In the case of a plurality of quantum dots 4a having different diameters, since wavelengths (energy) of the light for generating hole burning are different respectively, data may be read from respective quantum dots 4a by changing the wavelength of the irradiated light.

An optical semiconductor memory device according to a fifth embodiment, which comprises a semiconductor including the above quantum dots in part of the bipolar transistor, will be explained with reference to FIG. 10. The energy band of the optical semiconductor memory device is shown in FIG. 11.

Figure 10:
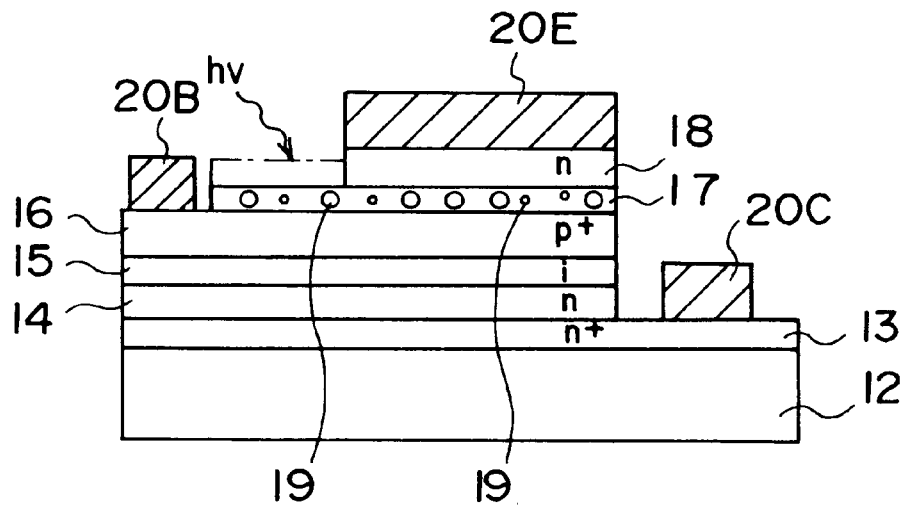
FIG. 10 is a sectional view showing a structure of an optical semiconductor memory device according to a fifth embodiment of the present invention.
Figure 11:
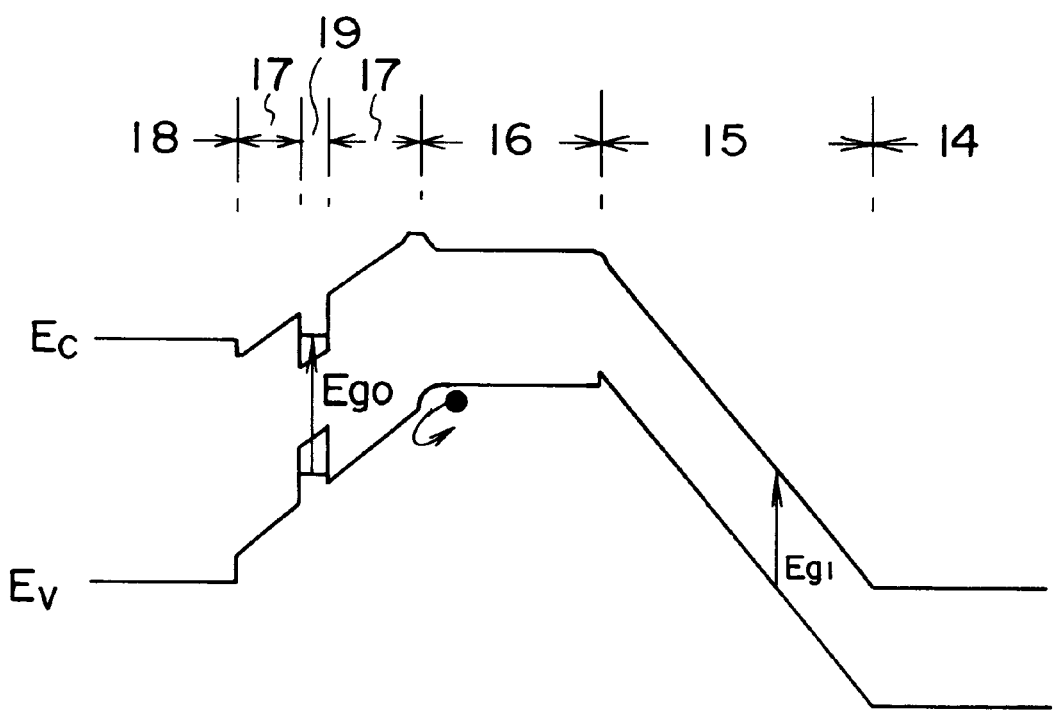
FIG. 11 is an energy band diagram of the optical semiconductor memory device according to the fifth embodiment of the present invention.

In FIG. 10, a collector contact layer 13 formed of n+ type GaAs of impurity dose $5 \times 10^{18}$ atoms/cm$^3$, a collector layer 14 formed of n type GaAs of impurity dose $5 \times 10^{17}$ atoms/cm$^3$, a first i layer 15 formed of undoped GaAs, a base layer 16 formed of p+ type GaAs of impurity dose $5 \times 10^{18}$ atoms/cm$^3$, a second i layer 17 formed of undoped AlAs, and an emitter layer 18 formed of n type Al$_{0.5}$Ga$_{0.5}$As of impurity dose $5 \times 10^{17}$ atoms/cm$^3$ are formed in sequence on a GaAs substrate 12.

Quantum dots 19 formed of InAs are formed in the second i layer 17. With respect to respective thicknesses, the collector contact layer 13 is 300 nm, the collector layer 14 is 200 nm, the first i layer 15 is 300 nm, the base layer 16 is 100 nm, the second i layer 17 is 100 nm, and the emitter layer 18 is 200 nm.

In this bipolar transistor, separation energy Ego of the quantum dots 19 in the AlAs i layer 17 is wide rather than bandgap Eg$_1$ of the first i layer 15. Energy barrier caused by the second i layer 17 against the base layer 16 becomes higher, which can therefore prevent holes from entering readily from the base layer 16 to the quantum dots 19.

In FIG. 10, a reference 20C denotes a collector electrode; 20B, a base electrode; and 20E, an emitter electrode.

Next, the methods for reading/writing information from/into the quantum dots in the bipolar transistor will be explained.

(i) writing method

Figure 12A:
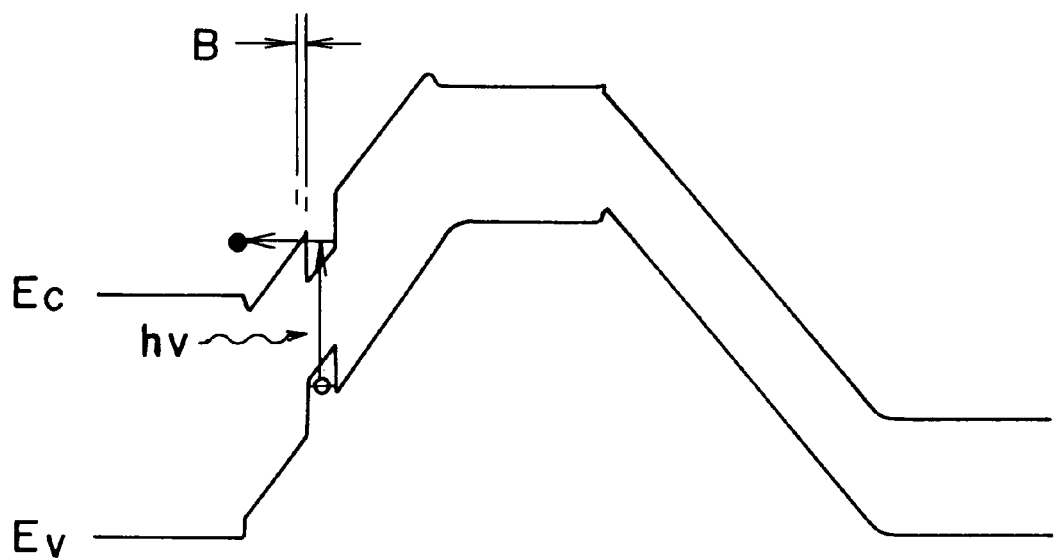
FIGS. 12A and 12B are energy band diagrams of the optical semiconductor memory device according to the fifth embodiment of the present invention when information are being read or written.

When a backward bias voltage is applied between the emitter 18 and the base layer 16 to write information, an energy band is generated as shown in FIG. 12A. Where a gradient of energy in the second i layer 17 may be enhanced, the energy barrier B of the quantum dots 19 on the emitter layer 18 side may become thin. For this reason, it is easy to write data "1" since transition of electrons from the quantum dots 19 to the emitter layer 18 because of tunneling can be facilitated. In this event, it is preferable that generation of current due to optical absorption in the first i layer 15 would be suppressed by either not-applying the backward voltage between the collector layer 14 and the base layer 16 or applying the forward bias voltage therebetween. Writing of data "0" may be performed if the light is not irradiated.

(ii) reading method

No bias voltage is applied between the emitter 18 and the base layer 16 upon reading information. Therefore, since energy barrier B of the quantum dots 19 on the emitter layer 18 side may thicken, electrons do not readily drift to the emitter 18 side to cause easy recombination even if the hole-electron pairs are created in the quantum dots 19 by irradiation of the reading light. As a result, no hole burning is caused.

For this reason, a data "0" cannot be destroyed by the reading light. Since a data "1" corresponds to the situation that the quantum dots 19 are in a hole burning state, no data destruction would be caused by light irradiation.

Figure 12B:
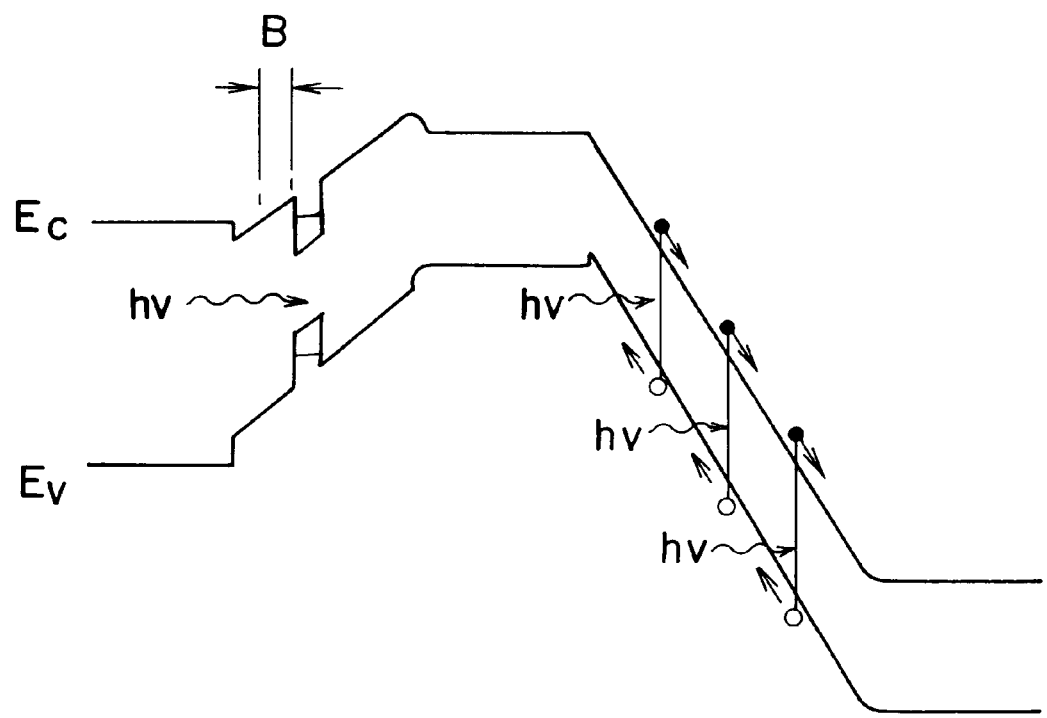

It is preferable that, as shown in FIG. 12B, the backward bias voltage may be applied between the collector layer 14 and the base layer 16 in reading information. Thereby, in case data "1" has been written, the reading light will pass through the quantum dots 19 and is then absorbed by the first i layer 15. Although the hole-electron pairs are created by this absorption in the first i layer 15, electrons move to the collector 14 while holes move to the base layer 16, which result in the optical current. An amount of current between the collector and the base may be increased by this optical current.

Accordingly, it would be understood that, if quantity of optical absorption is large or if the collector/base current is large, a data "1" has been written. In this case, holes can move to the base layer 16. But a data "0" cannot be changed into data "1" due to transition of holes from the base layer 16 to the quantum dots 19 since high hole barrier is formed between the base layer 16 and the emitter layer 18 and in addition naturally holes do not readily pass through the barrier.

On the other hand, if a data "0" has been written, the reading light may be absorbed in the quantum dots 19, so that the quantity of light reaching the first i layer 15 may be reduced. Because of this reduction, optical current flowing through the first i layer 15 may be reduced.

Accordingly, it would be understood that, if quantity of optical absorption is small or if the collector/base current is small, data "0" has been written. Since there is a possibility that written information will be changed, optical current can be prevented by either not-applying the bias voltage between the collector and the base or applying the forward bias voltage therebetween.

According to this reading method, if the backward bias voltage has been applied between the collector and the base, quantity of current flowing between the collector and the base becomes different depending on difference in quantity of optical absorption. It is feasible to detect stored information according to difference in the quantity of current.

According to this example, since reading and writing can be executed independently, a refresh operation can be eliminated.

The first i layer 15 may be omitted. In this case, the collector layer may be formed of a semiconductor material which has a smaller bandgap than separation energy of the quantum dots 19 to generate optical current.

If band energy of the first i layer 15 is larger than separation energy of the quantum dots 19, like the first or second embodiment, data may be read according to change in the collector current or change in optical absorption factor.

In addition, in case high voltage to cause avalanche breakdown has been applied between the base layer 16 and the collector layer 14, sensitivity to detect change in quantity of received light can be enhanced to thereby accelerate a response speed of the memory device. For this reason, gain can be provided with respect to the light and an S/N ratio can be increased.

It should be noted that, although in the fifth embodiment the npn bipolar transistor has been employed, the quantum dots may be provided in part of the pnp bipolar transistor.

Next, an optical semiconductor memory device in which the layer including the quantum dots therein is formed in the pin junction type photodiode will be explained with reference to FIGS. 13A and 13B, according to a sixth embodiment of the invention.

Figure 13A:
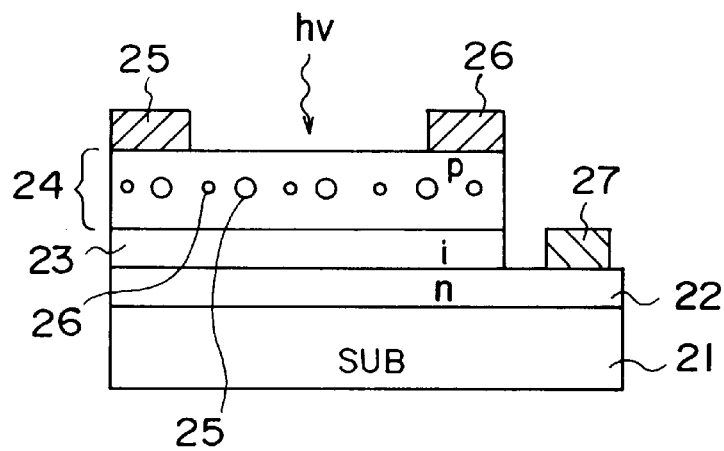
FIG. 13A is a sectional view showing a structure of an optical semiconductor memory device according to a sixth embodiment of the present invention.
Figure 13B:
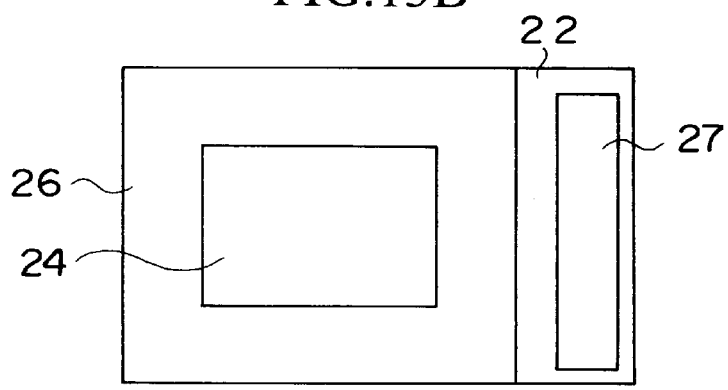
FIG. 13B is a plan view showing the structure of the optical semiconductor memory device in FIG. 13A.

Referring to FIGS. 13A and 13B, an n type GaAs layer 22 of a 300 nm thickness, an undoped $In_{0.1}Ga_{0.9}As$ layer 23 of a 100 nm thickness, and a p type AlAs layer 24 of a 200 nm thickness are formed in order on a semi-insulating substrate 21 formed of GaAs. A plurality of differently sized quantum dots 25 formed of GaAs or InGaAs are formed in a 10 nm region in the center of the p type AlAs layer 24.

A p side ring-like electrode 26 is formed on the p type AlAs layer 24 while an n side electrode 27 is formed on the n type GaAs layer 22.

Impurity concentration of the n type GaAs layer 22 is $5 \times 10^{18}$ atoms/cm$^3$, and impurity concentration of the p type AlAs layer 24 is $5 \times 10^{18}$ atoms/cm$^3$.

Figure 13C:
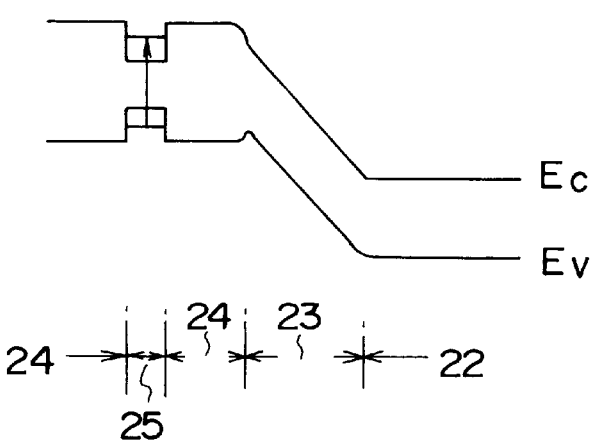
FIG. 13C is an energy band diagram of the optical semiconductor memory device in FIG. 13A.

As shown in FIG. 13C, the pin photodiode having such quantum dots 25 has a energy band structure. Since a plurality of differently sized quantum dots 25 are present in the p type AlAs layer 24, wavelength of the light for generating the hole-electron pairs should be changed according to the size of the quantum dots 25, as has been discussed above, and in addition respective quantum dots 25 may absorb only the light of wavelength corresponding to each separation energy.

Furthermore, hole burning is caused in the quantum dots 25 which have absorb the light and thus holes are confined therein. Even if the light of the identical wavelength is irradiated again, the light may transmit the quantum dots 25.

Since the undoped $In_{0.1}Ga_{0.9}As$ layer 23 has a smaller energy bandgap than that of the material of the quantum dots 25, the light passing through the quantum dots 25 may be absorbed by the undoped $In_{0.1}Ga_{0.9}As$ layer 2 to create the hole-electron pairs, as in the usual pin photodiode, thus making the optical current flow. The light has the same energy as separation energy of the quantum dots 25.

Therefore, in the memory device of the sixth embodiment, data "1" or "0" may be written depending upon whether the light is irradiated or not. Since the optical current becomes different according to whether or not holes are present in the quantum dots 25, it is feasible to read stored information by measuring the current flowing between the p side electrode 26 and the n side electrode 27.

Since the quantum dots 25 are in a hole burning state after stored information have been read, the refresh operation is required.

In the seventh embodiment, an optical semiconductor memory device in which the quantum dots are formed on different locations in comparison with the sixth embodiment will be explained, with reference to FIG. 14.

Figure 14:
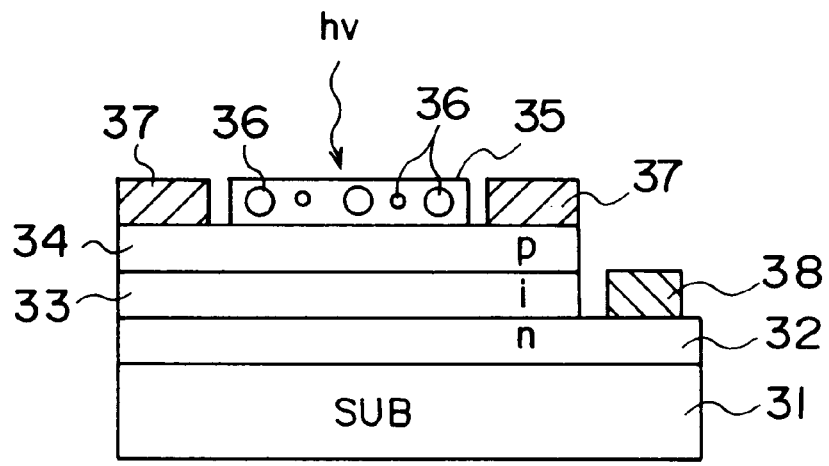
FIG. 14 is a sectional view showing a structure of an optical semiconductor memory device according to a seventh embodiment of the present invention.

Referring to FIG. 14, an n+type GaAs layer 32 of a 300 nm thickness, an undoped $In_{0.1}Ga_{0.9}As$ layer 33 of a 100 nm thickness, and a p type AlAs layer 34 of a 200 nm thickness are formed in order on a semi-insulating substrate 31 formed of GaAs.

An undoped AlAs layer 35 of 50 nm thickness is formed in a region which being surrounded by a p side ring-like electrode 26 and on the p type AlAs layer 34. A plurality of quantum dots 36 formed of GaAs and having different sizes are formed in the undoped AlAs layer 35.

In addition, an n side electrode 27 is formed on the n+ type GaAs layer 32.

Impurity concentration of the n+ type GaAs layer 32 is $5 \times 10^{18}$ atoms/cm$^3$, and impurity concentration of the p type AlAs layer 34 is $5 \times 10^{18}$ atoms/cm$^3$.

In the seventh embodiment, like the sixth embodiment, reading/writing of information can be executed.

An example according to an eighth embodiment will be explained hereinafter wherein a light emitting device used for reading/writing information and the optical semiconductor memory device according to the sixth embodiment are integrally formed.

Figure 15:
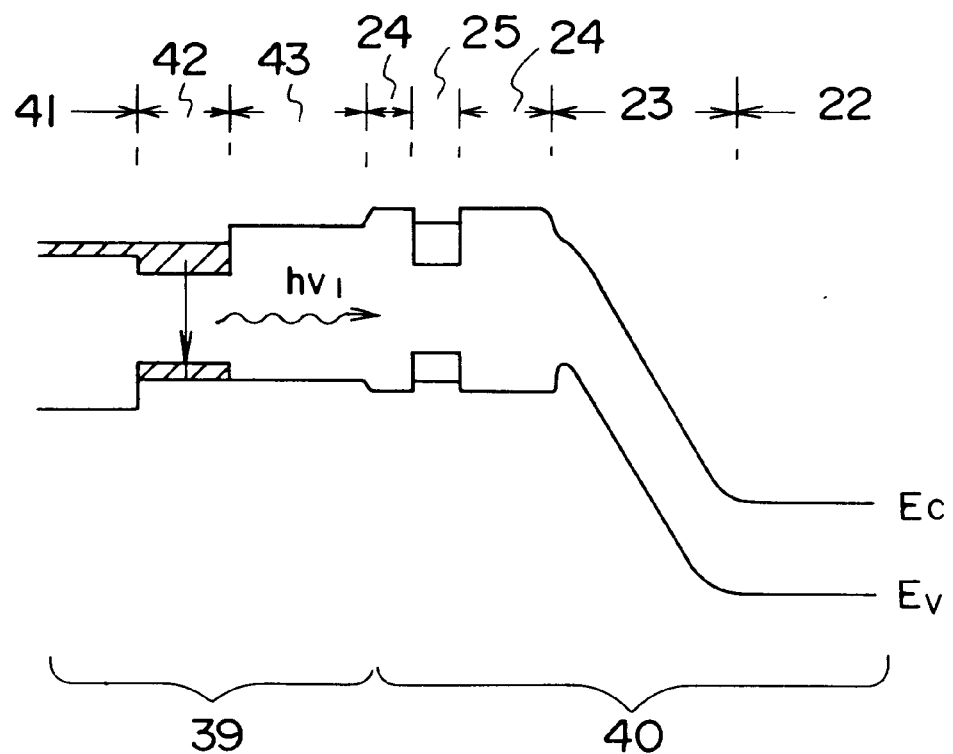
FIG. 15 is an energy band diagram of the optical semiconductor memory device according to the seventh embodiment of the present invention with a light emitting device connected thereto.

For the purposes of example, a surface light emission type semiconductor laser may be used as the light emitting device, and the pin photodiode according to the sixth embodiment may be stacked thereon. An energy band diagram is shown in FIG. 15.

An n type cladding layer 41, an undoped active layer 42 and a p type cladding layer 43 may be formed in sequence on a GaAs substrate (not shown). Then, a first reflection film (not shown) may be formed on the bottom surface of the GaAs substrate, and a second reflection film (not shown) may be formed on the p type cladding layer 43, thereby completing a semiconductor laser 39. In addition, the optical semiconductor memory device 40 may be formed on the second reflection film.

By way of example, an $In_{0.5}(Ga_{1-x}Al_x)_{0.5}P$ layer may be used as the cladding layers 41 and 43, and also an $In_{0.5}(Ga_{1-y}Al_y)_{0.5}P$ layer may be used as the active layer 42 (x>y).

The optical semiconductor memory device 40 formed on the p type cladding layer 43 has the same layer structure as the sixth embodiment, and comprises the p type AlAs layer 24 including the quantum dots 25, the undoped $In_{0.1}Ga_{0.9}As$ layer 23, and the n type GaAs layer 22.

In a ninth embodiment, an optical semiconductor memory device employing the npn junction type phototransistor as a basic structure will be explained with reference to FIG. 16.

Figure 16A:
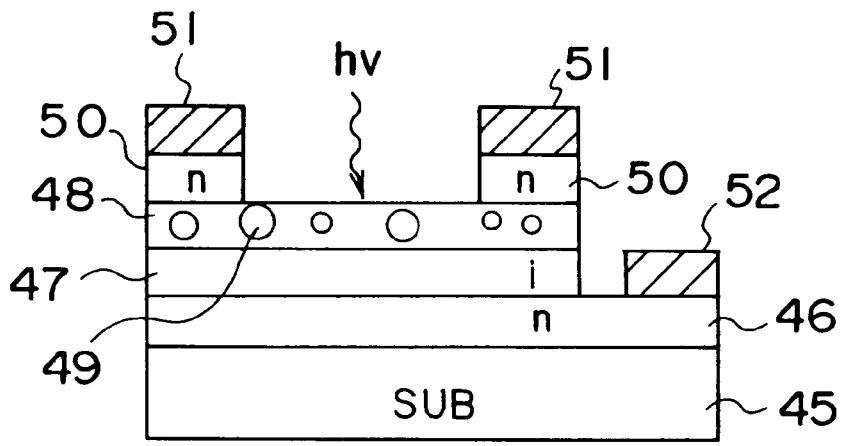
FIG. 16A is a sectional view showing a structure of an optical semiconductor memory device according to an eighth embodiment of the present invention.
Figure 16B:
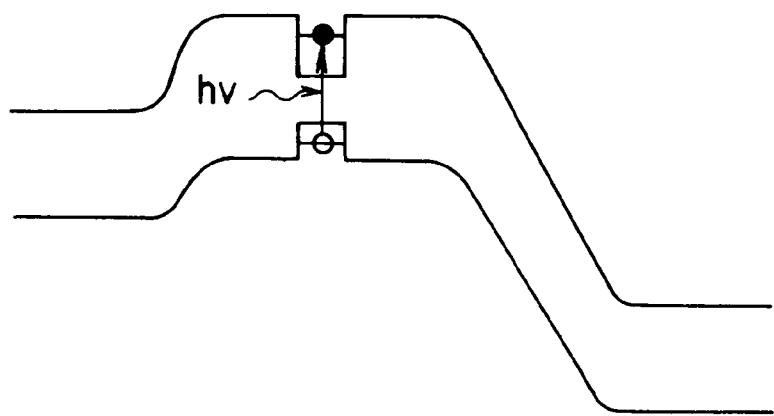
FIG. 16B is an energy band diagram of the optical semiconductor memory device in FIG. 16A.
Figure 16B:
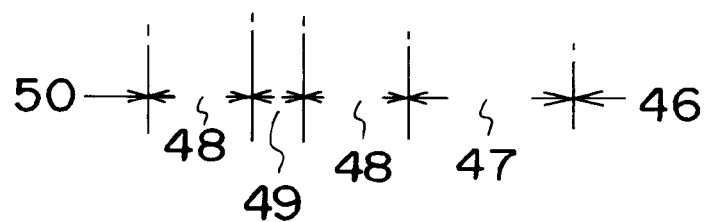

In FIG. 16A, an n type GaAs collector layer 46, an undoped GaAs subcollector layer 47, a p type AlAs base layer 48 may be formed in order on a GaAs substrate 45. In addition, a ring-like n type GaAs emitter layer 50 and an emitter 51 are formed on the p type AlAs base layer 48. A plurality of differently sized quantum dots formed of GaAs are formed in part or entire of the base layer 48. A collector electrode 52.is connected to the collector layer 46.

In the memory device, since the bandgap of the subcollector layer 47 is narrower than bandgap of the quantum dots, the light passing through the quantum dots may irradiate the subcollector layer 47 to create the hole-electron pairs, thereby flowing the collector current.

Figure 17:
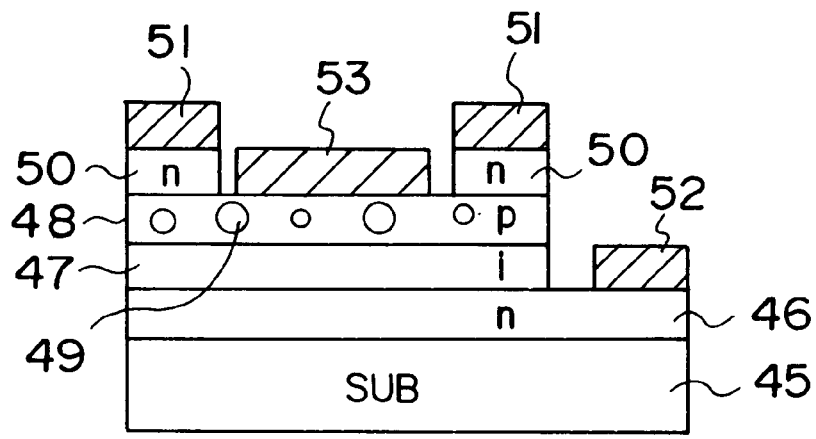
FIG. 17 is a sectional view showing a structure of a bipolar transistor which is formed by covering the optical semiconductor memory device according to the eighth embodiment of the present invention with a light shielding film.

In any event, the bipolar transistor may be formed additionally on one GaAs substrate 45, as follows. In other words, first two devices with the structure in FIG. 16A may be formed, then a metal base electrode 53 shown in FIG. 17 may be formed on the base layer 48 of one of the device. As a result, since the base layer 48 can be shielded by the base electrode 53, the device be capable of serving as the normal bipolar transistor. Note that a multi-emitter type bipolar transistor may be used as the bipolar transistor.

Figure 18:
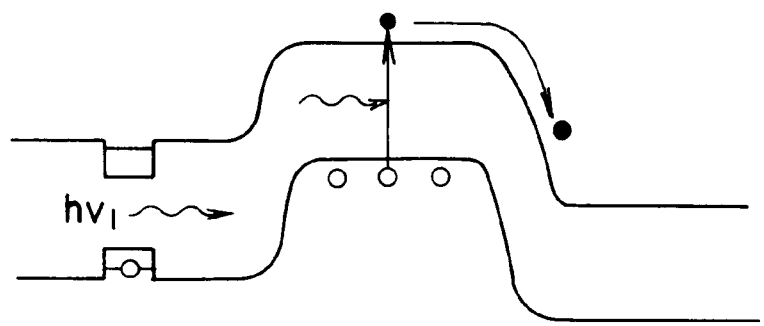
FIG. 18 is an energy band diagram of the optical semiconductor memory device according to the eighth embodiment of the present invention wherein quantum dots are formed in an emitter region.
Figure 18:
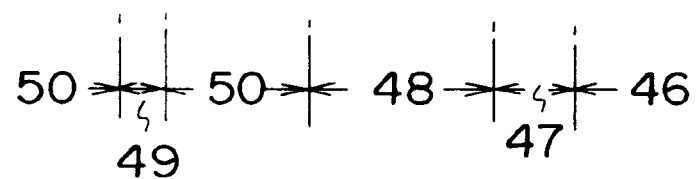

The quantum dots 49 may be formed in the emitter 50, not in the base layer 48. In this case, the base layer 48 may be formed of the p type GaAs and the emitter layer 50 may formed of the n type AlAs. Energy bandgap is like FIG. 18.

While the quantum dots 49 in the emitter layer 50 are in hole burning condition, the light irradiated to read information may pass through the emitter layer 50 and then irradiate the base layer 48. Since energy bandgap of the base layer 48 would be small rather than separation energy of the quantum dots 49, the hole-electron pairs may be created by light irradiation in the base layer 48 to thus result in excessive holes in the base layer 48. Therefore, collector current may be varied.

In the ninth embodiment, the quantum dots have been provided in the phototransistor. Therefore, if hole burning is caused in the quantum dots, since holes and electrons created between the base layer and the collector layer are amplified by the reading light, optical current may be increased.

In order to reset (initialize) information in the quantum dots wherein hole burning has been caused, by increasing the quantity of light having the same energy as separation gap of the quantum dots, electrons generated between the base layer and the collector layer are supplied to the quantum dots to cause recombination therein. Note that information may be reset by applying a high voltage across the quantum dots to cause recombination therein.

As for the light receiving device such as photodiode and phototransistor, if many quantum dots having different sized are formed, reading/writing information from/into desired quantum dots are enabled by selecting the light having the identical energy to separation gaps of respective quantum dots and irradiating the light to the desired quantum dots. In other words, memory cells are present corresponding to the number of sizes of the quantum dots, and addressing corresponding to wavelength of the light is enabled. Therefore, storage capacity can be significantly increased.

In a tenth embodiment, an optical semiconductor memory device wherein the quantum dots may be applied to the multi-emitter type hetero junction bipolar transistor (HBT) will be explained hereinafter.

Figure 19:
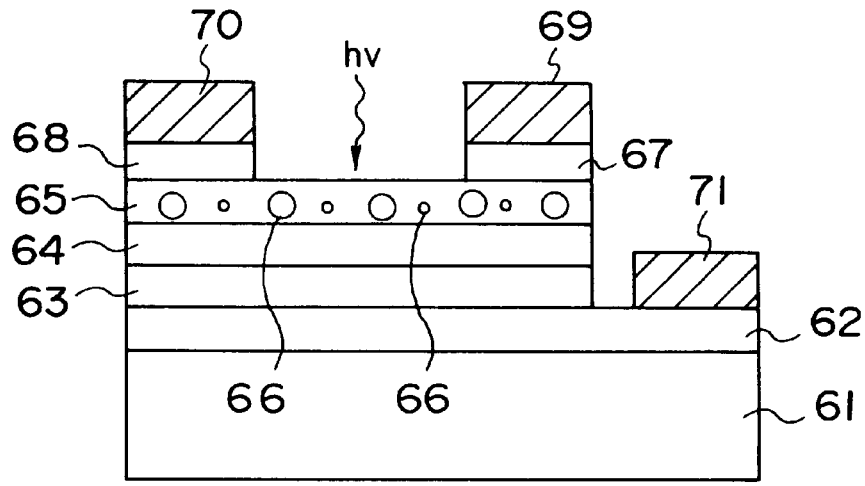
FIG. 19 is a sectional view showing a structure of an optical semiconductor memory device according to a tenth embodiment of the present invention.

In FIG. 19, an n+ type GaAs collector layer 62 of a 200 nm thickness, an undoped GaAs subcollector layer 63 of a 100 nm thickness, a p type GaAs base layer 64 of a 50 nm thickness, and an n type $In_{0.5}Ga_{0.5}P$ emitter layer 64 of a 50 nm thickness may be formed in order on a GaAs substrate 61. In addition, a plurality of n+ type GaAs emitter contact layers 67, 68 (only two layers are shown in FIG. 19) of a 200 nm thickness are formed at a distance on the emitter layer. Emitter electrodes 69, 70 are formed thereon. A plurality of differently sized quantum dots formed of GaAs are formed in the emitter layer 65.

Impurity concentration of the collector layer 62, base layer 64, emitter layer 65, emitter contact layers 67, 68 are $5 \times 10^{18}$ atoms/cm$^3$.

No base electrode is provided in the multi-emitter type HBT. If voltages on respective emitter electrodes 69, 70 are equal, the current may not flow through the collector layer 62. Unless voltages on respective emitter electrodes 69, 70 are equal, the current may flow through the collector layer 62. Applied voltages to the emitter electrodes 69, 70 may be set higher than that of the collector layer 62.

In the above semiconductor devices, when stored information is read from a plurality of quantum dots having different size or information should be written into the same, the light of wavelength corresponding to separation energy of each quantum dot may be irradiated to the quantum dots while scanning it consecutively. Otherwise, the lights of different wavelengths may be irradiated to respective quantum dots simultaneously. More particularly, since separation energy of the quantum dots would depend on size, growth temperature, etc., information may be read/write by irradiating the light of specific wavelength to respective quantum dots, according to an eleventh embodiment. Since hole burning would not be generated by the light except for the light of specific wavelength in the quantum dots, no error will be caused if the lights of different wavelengths are irradiated simultaneously or consecutively.

Figures 20A, 20B:
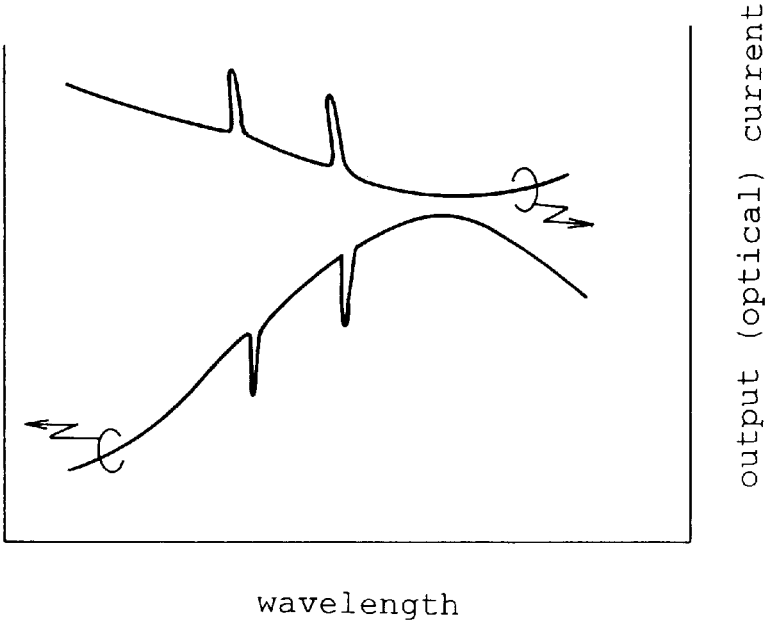
FIGS. 20A and 20B are characteristic views showing respectively an optical absorption coefficient characteristic and a spectral sensitivity characteristic in case a light having different wavelengths used for reading/writing information from/into the optical semiconductor memory device according to the tenth embodiment of the present invention.

FIG. 20A shows an optical absorption saturation characteristic in case the lights of different wavelengths are irradiated consecutively. In FIG. 20A, in the quantum dots having separation energy corresponding to wavelength at which optical absorption coefficient is reduced, hole burning has been caused by light irradiation. If hole burning is caused, the optical current may be increased by the electrons released from the quantum dots.

A great quantity of information can therefore be read/written by scanning the lights of different wavelengths consecutively.

As shown in a spectral sensitivity characteristic of FIG. 20B, light receiving sensitivity may be different according to wavelength in the pin junction photodiode. In the event that the quantum dots are formed in such a device, wavelength of read information can be detected based on the value of optical absorption coefficient if a relationship between optical absorption coefficient and wavelength has been measured preliminarily. It would be understood that this leads to particular wavelengths of the light by which devices must be refreshed.

A plenty of memory cells described above may be aligned on one substrate in the X and Y directions in a matrix fashion. The optical semiconductor memory devices in the above embodiments may be considered as the memory cell.

Figure 21:
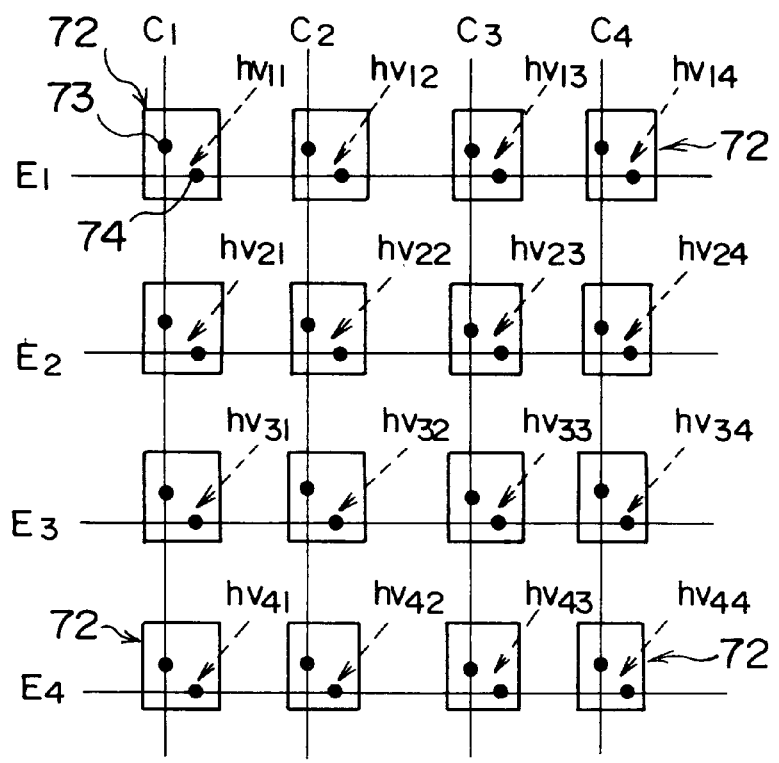
FIG. 21 is a circuit diagram showing an optical semiconductor memory device according to a twelfth embodiment of the present invention.

According to a twelfth embodiment, as shown in FIG. 21, first electric wirings $E_1$ to $E_4$ may be arranged in the X direction, and second electric wirings C1 to C4 may be arranged in the Y direction. Both wirings are connected to two electrodes 73, 74 of memory cells 72 near intersecting portions of these electric wirings. As these two electrodes, there may be the n side electrode and the p side electrode of the above optical semiconductor memory devices, or the emitter electrode and the collector electrode.

In order to irradiate the light $hv_{11}$ to $hv_{44}$ for reading/writing information from/into these memory cells 72, optical wirings (not shown) may be arranged on the first electric wirings $E_1$ to $E_4$ and the second electric wirings C1 to C4. For example, optical shutters which are arranged on the pixels of the image display device may be listed as the optical wirings. If batch reading/writing of information should be effected by irradiating the lights $hv_{11}$ to $hv_{44}$ of different wavelengths to the memory cells 72 simultaneously, a spot-like light may be irradiated to all memory cells 72.

According to these wirings, since the electric wirings and the optical wirings have been used, effective wirings eliminating interference between the light and the electricity can be obtained.

If the electrons and holes are recombined in the quantum dots by injecting the electrons into the quantum dots in which only the holes are confined, hole burning in the quantum dots may disappear and therefore data may be reset to "0". As a result, processing speed can be accelerated and simplified by injecting the electrons into all quantum dots collectively.

For instance, as the method for injecting the electrons into the quantum dots, there may be a method for applying the forward bias voltage to the p type semiconductor layers and the n type semiconductor layers which are around the quantum dots. In the event of the multi emitter type HBT shown in the tenth embodiment, if the electrons are supplied to the quantum dots by flowing the current between plural emitters, hole burning would not be caused in the quantum dots.

Like the above, if the current is supplied to the memory cell 72 after selecting any one of the first electric wirings $E_1$ and any one of $E_4$ and the second electric wirings C1 to C4, writing of the selected optical semiconductor memory devices may be disabled. This signifies that selection of the optical semiconductor memory devices is enabled.

Thus, selecting the memory cell for writing enables the small spot diameter light for selecting the memory cell to be omitted. This leads to the fact that the light may be irradiated collectively to a plurality of memory cells 72.

In the thirteenth embodiment, an example wherein data may be reset by light irradiation will be explained.

Figure 22:
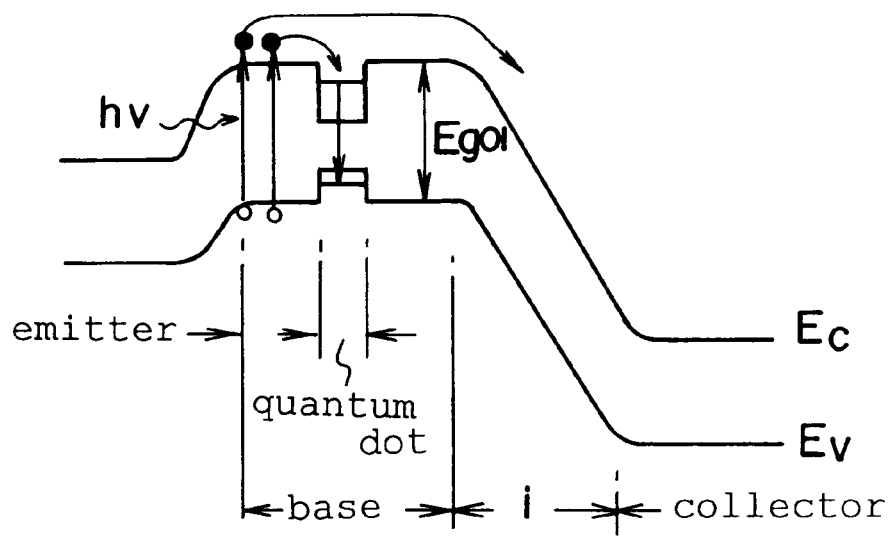
FIG. 22A is an energy band diagram of an optical semiconductor memory device according to a thirteenth embodiment of the present invention wherein a hole burning state is eliminated.
FIG. 22B is an energy band diagram showing an energy range which causes a hole burning state in the optical semiconductor memory device in FIG. 22A.

For purposes of illustration, in the bipolar transistor type memory cell in FIG. 22, if the light hv having energy more than bandgap $Eg_{01}$ of the base layer including the quantum dots is irradiated, accumulation of holes in the valence band of the base layer may be enhanced, so that potential of the base layer may be lowered to flow the current to the base layer. Thereby, since the electrons may be supplied to a plurality of quantum dots in the base layers, hole burning may disappear and data in the quantum dots may be reset to "0". In case a plurality of quantum dots are formed in one base layer, data in all quantum dots become "0" according to light irradiation.

Figure 23:
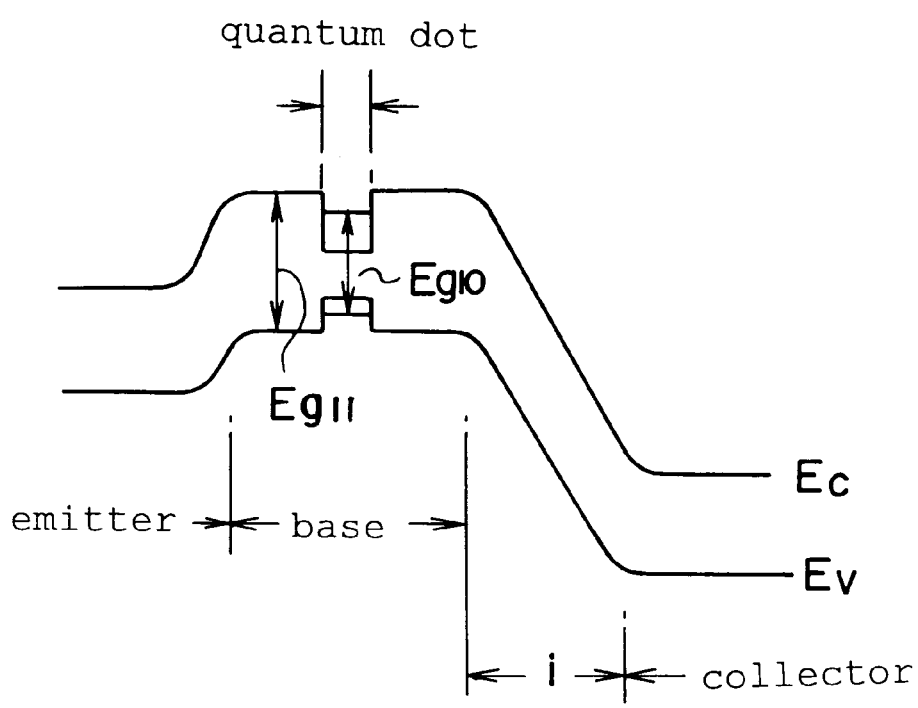
FIG. 23 is a sectional view showing a structure of an optical semiconductor memory device according to a fourteenth embodiment of the present invention.

In the event that a plurality of quantum dots having different sizes reside in one base layer, as shown in FIG. 23, first the quantum dot having the largest size may be selected, and then the light of wavelength band corresponding to energy which is more than separation energy of the quantum dot and less than energy bandgap of the base layer may be irradiated to the base layer. As a result, hole burning is caused in all quantum dots in the base layer, and thus data of all quantum dots may be set to "1".

The reason why the largest size quantum dot has been selected is that the ground level of this quantum dot is small rather than the ground level of other quantum dots.

A plurality of quantum dots constituting the above optical semiconductor memory devices may be realized in the form of a multilayered structure, in accordance with a fourteenth embodiment.

Figure 24:
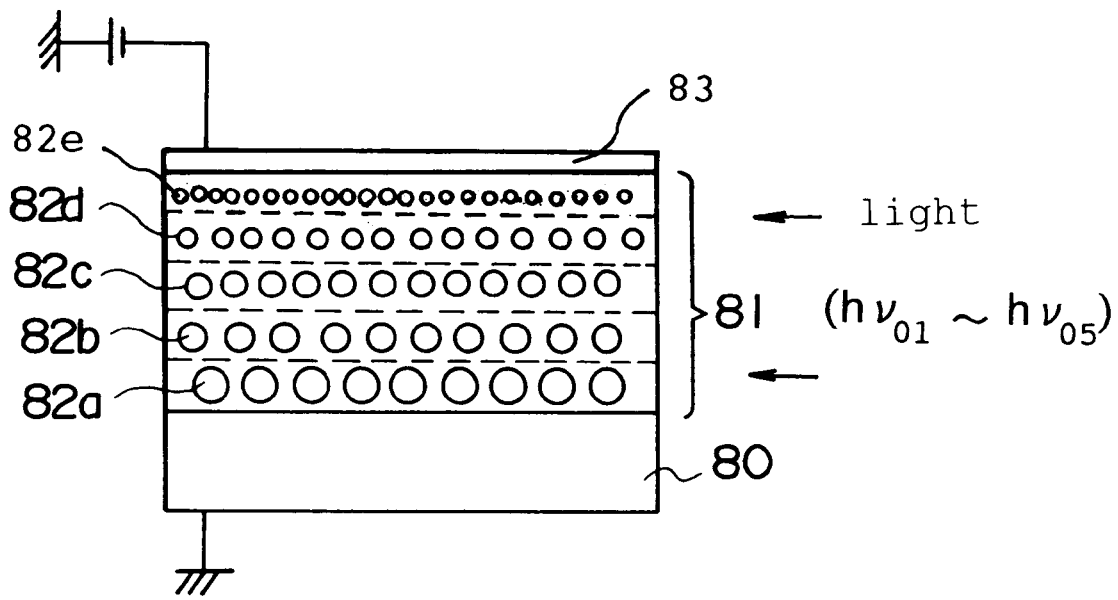
FIG. 24 is a view showing size, density of quantum dots and growth temperature in the optical semiconductor memory device according to the fourteenth embodiment of the present invention.

For instance, as shown in FIG. 24, with respect to a plurality of quantum dots 82a to 82e formed in a semiconductor layer 81 on an n type semiconductor substrate 80, sizes of the quantum dots 82a to 82e may be rendered even in the surface direction, whereas sizes thereof may be rendered different in the thickness direction. In this case, the quantum dots 82a to 82e may be stacked in the order of larger size of the diameter, or the quantum dots 82a to 82e may be stacked in the order of smaller size of the diameter, or the quantum dots 82a to 82e may be piled up at random regardless of the diameter.

Figure 25:
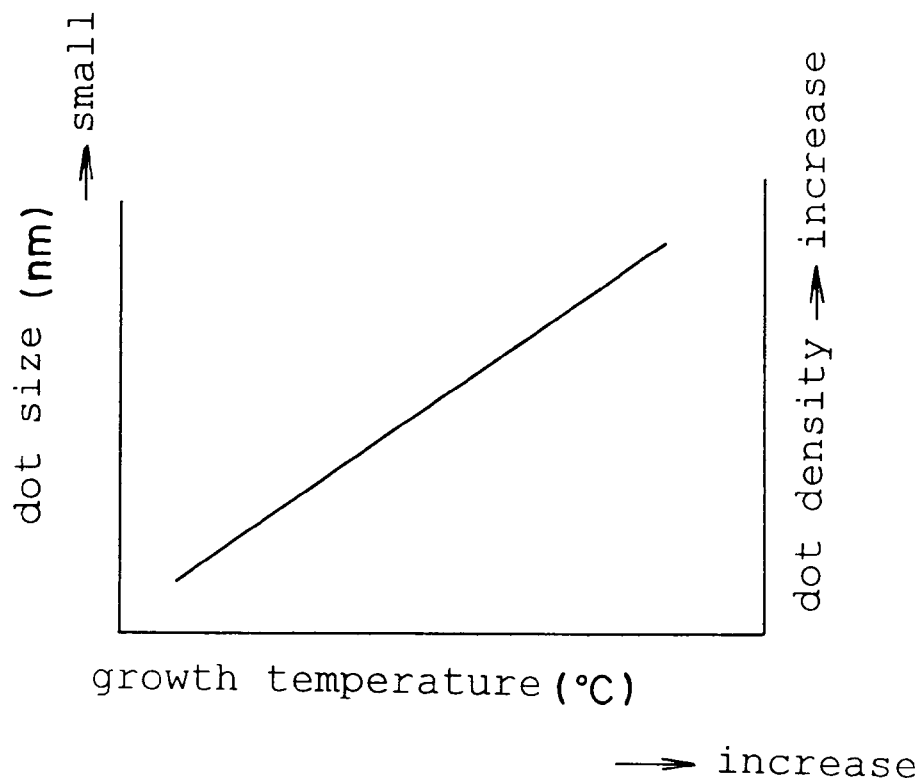
FIG. 25 is a view showing a relationship between size of quantum dots and an InAs supply amount in a step of forming quantum dots formed of InAs in the optical semiconductor memory device according to the fourteenth embodiment of the present invention.

As shown in FIG. 25, the higher the growth temperature, the smaller the size of the quantum dots 82a to 82e and also the higher the density. For this reason, a structure shown in FIG. 24 can be derived by adjusting the growth temperature of the semiconductor constituting the quantum dots 82a to 82e.

By controlling the number of size of the quantum dots 82a to 82e, it would be feasible to control the bit number in one semiconductor layer 81.

The technique for changing size of the quantum dots 82a to 82e has been discussed, for example, by J. Oshinowo et. al., Appl. Phys. Lett. 65 (11), Sep. 12, 1994, pp. 1421–1423.

Figure 26:
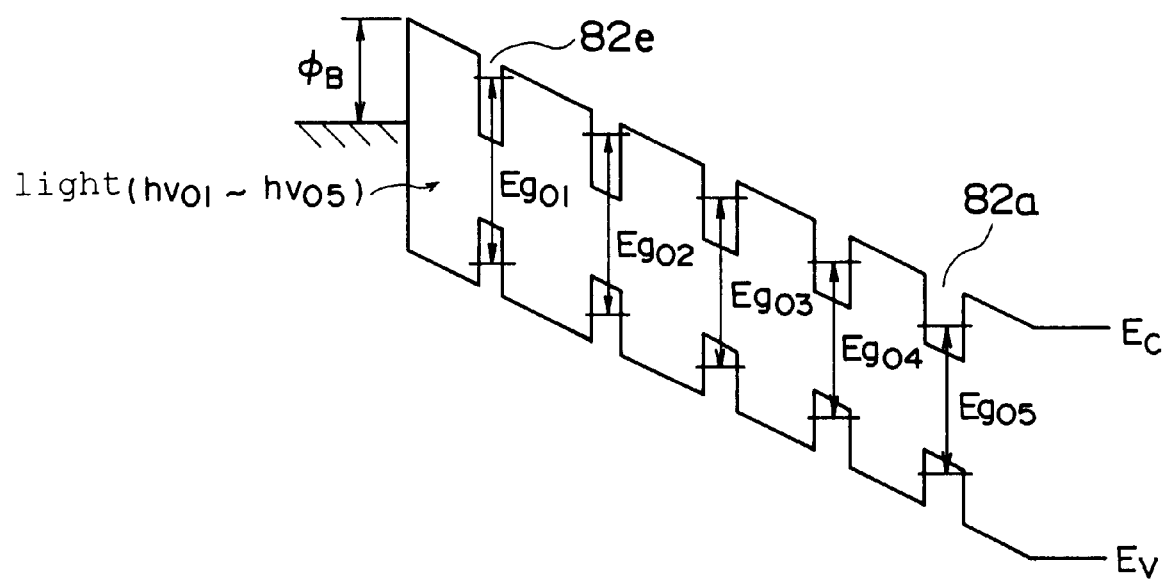
FIG. 26 is an energy band diagram of the optical semiconductor memory device according to the fourteenth embodiment of the present invention.

A band diagram shown in FIG. 26 may be obtained if diameters of a plurality of quantum dots arranged in the film thickness direction are made different, and, as shown in FIG. 24, the n type GaAs substrate may be used as the semiconductor substrate 80 and the AlAs or AlGaAs layer may be used as the semiconductor layer 81 and the InGaAs dots may be used as the quantum dots 82a to 82e, and in addition the electrode 83 being Schottky-contacted to the semiconductor layer 81 may be formed on the semiconductor layer 81. In this event, the quantum dots 82a to 82e have been laminated in the order of larger size.

The method for reading/writing information from/into the optical memory device as discussed above will be as follows.

First, writing procedures of information will be explained hereinbelow.

If the electron-hole pairs are created in the uppermost quantum dot 82e by irradiating the light of specific wavelength to emit the electrons to the exterior of the uppermost quantum dot 82e by means of a tunneling effect, the electrons may be caused to move to the semiconductor substrate 80 by the electric field which is applied between the electrode 83 and the semiconductor substrate 80. However, voltage of the semiconductor substrate 80 has been rendered higher than that of the electrode 83 because the voltage has been applied between the electrode 83 and the semiconductor substrate 80.

But there is such a drawback that, if a data "1" has already been written by irradiating the light to the lower quantum dot 82b before the electrons come to the semiconductor substrate 80, the electrons being moved from the uppermost quantum dot 82e may be recombined with holes in the lower quantum dot 82b, thus rewriting information in the lower quantum dot 82b to a data "0".

Accordingly, in the case of the optical device having the quantum dots 82a to 82e in the form of the multilayered structure, it would be preferable to write information into the quantum dots in the order of a lower potential quantum dot. In FIG. 24, information must be written in the order of the farther side from the semiconductor substrate 80.

Next, reading procedures of information will be explained hereinbelow.

Assuming that a data "0" has been written into the uppermost quantum dot 82e, and if information has been read by irradiating the light of specific wavelength to the quantum dot 82e, the electrons are emitted from the quantum dot 82e. At that time, there is a possibility the electrons may be recombined in the lower quantum dot 82b wherein information "1" has already been written, to thus rewrite information "1" to "0".

Consequently, in the case of the optical device having the quantum dots 82a to 82e formed as the multilayered structure, it would be preferable to read information from the quantum dots in the order of higher potential quantum dot. In FIG. 24, information must be written in the order of the nearest side from the semiconductor substrate 80.

However, after reading information from all quantum dots 82a to 82e, rewriting may be required by resetting all quantum dots 82a to 82e. In other words, by flowing the current to Schottky barrier in the forward direction, all stored information may be reset to "0" by electron current.

In the fourteenth embodiment, although the electrode 83 which may be Schottky-contacted to the semiconductor layer 81 has been formed thereon, a p type semiconductor layer may be formed instead of the electrode 83. In that case, reset operation may be done by the current in the forward direction of the pn junction.

Figure 27:
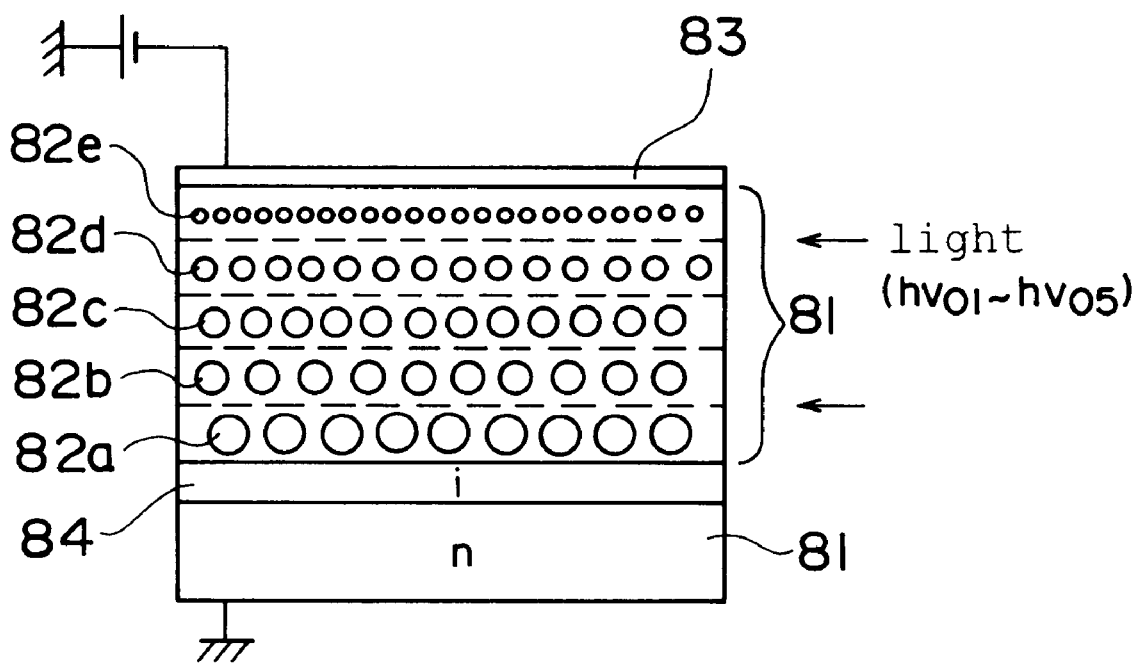
FIG. 27 is a sectional view showing a structure wherein an undoped semiconductor layer for generating avalanche breakdown is interposed in the optical semiconductor memory device according to the fourteenth embodiment of the present invention.

As shown in FIG. 27, in the case that an undoped semiconductor layer 84 formed of GaAs is interposed between the n type semiconductor substrate 80 and the semiconductor layer 81 and then high electric field is applied to the undoped semiconductor layer 84, it would be possible to obtain the signal of large magnitude because, as already discussed, the electrons may be amplified by avalanche breakdown.

The light may be irradiated to the optical memory device from either the lateral side of the semiconductor layer 81 or the upper side via the electrode 83 formed of transparent conductive material.

A following method may be employed to read/write information from/into the optical memory device having the quantum dots in the form of a multilayered structure according to a fifteenth embodiment, as shown in FIG. 24.

Figure 28:
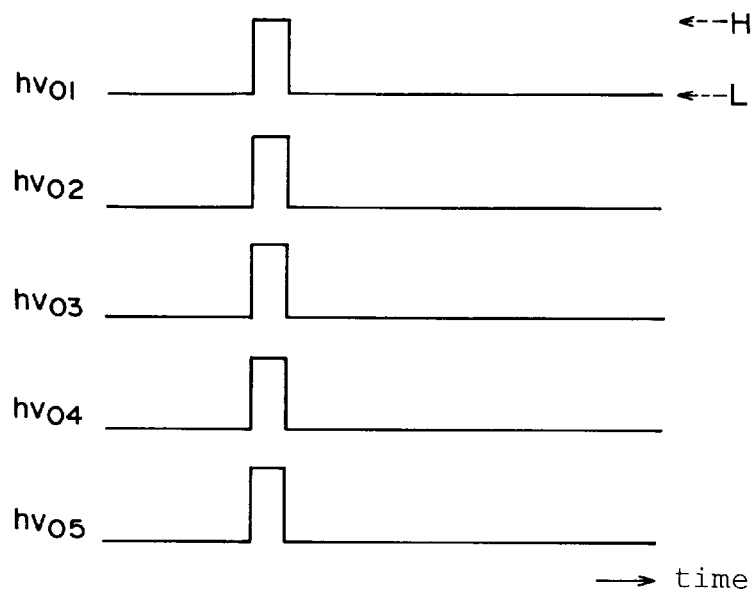
FIG. 28 is an optical waveform diagram showing simultaneous irradiation of a plurality of lights having different energy to write information into an optical semiconductor memory device according to a fifteenth embodiment of the present invention.
Figure 29:
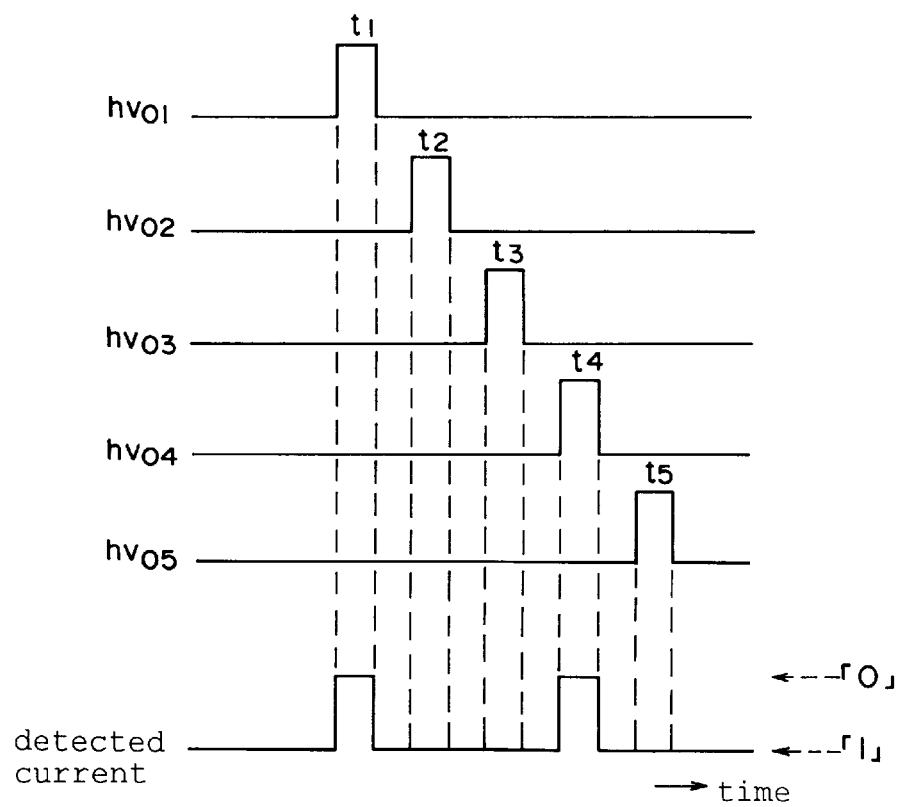
FIG. 29 is an optical waveform diagram showing consecutive irradiation of a plurality of lights having different energy to read/write information from/into the optical semiconductor memory device according to a fifteenth embodiment of the present invention, and a waveform diagram showing an example of change of current flowing through the optical semiconductor memory device.

In order to write information, as shown in FIG. 28, the composite light having energy $hv_{o1}$ to $hv_{o5}$ being identical to transition energy of respective quantum dots 82a to 82e may be irradiated simultaneously. Otherwise, as shown in FIG. 29, the light having plural energy $hv_{o1}$ to $hv_{o5}$ may be irradiated to respective quantum dots 82a to 82e individually in time series. Since respective quantum dots 82a to 82e can be written only by irradiating the light identical to transition energy, either method may be adopted. However, if the light is irradiated in series, it would be preferable to write information in the order of lower potential quantum dot, as shown in the fourteenth embodiment.

Here h is the Planck constant, and v is oscillation frequency of light.

Since data "0" or "1" may be decided by an amount of change in the current flowing through the semiconductor substrate 80, reading of information may be executed by irradiating the light of plural energy $hv_{o1}$ to $hv_{o5}$ to respective quantum dots 82a to 82e individually and sequentially in series, as shown in FIG. 29. However, as shown in the fourteenth embodiment, it would be preferable to determine the irradiation order of light such that information may be read in the order of higher potential of quantum dot.

In this event, as shown in FIG. 29, if optical pulses having different energy have been irradiated in sequence, detection current between the semiconductor substrate 80 and the electrode 83 may be changed in time sequence in accordance with irradiation timing of the optical pulses. As a result, data may be output.

Energy difference (transition energy) $Eg_{o1}$ of ground levels between the conduction band and the valence band in the quantum dots is identical to $hV_{o1}$. Similarly, $Eg_{o2}$ is identical to $hv_{o2}$, $Eg_{o3}$ is identical to $hv_{o3}$, $Eg_{o4}$ is identical to $hv_{o4}$, and $Eg_{o5}$ is identical to $hv_{o5}$.

Figure 30A:
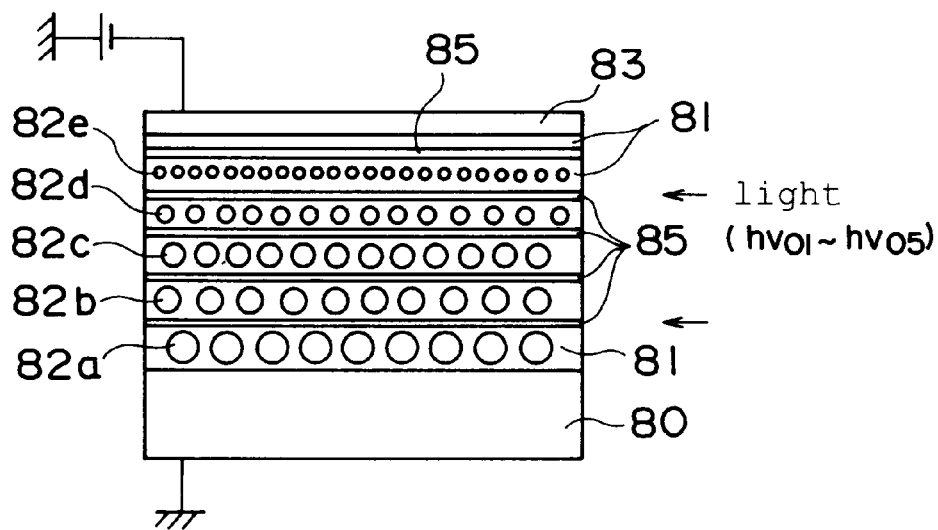
FIG. 30A is a sectional view showing a structure of an optical semiconductor memory device according to a sixteenth embodiment of the present invention.

In the optical memory device wherein the quantum dots are formed in the multilayered structure, a structure shown in FIG. 30A may be adopted to prevent tunneling of holes of the electron-hole pairs created by light irradiation in the quantum dots.

In FIG. 30A, like reference symbols in FIG. 24 identify like elements.

In that case, a second barrier layer 85 formed of the material which has high band offset of the valence band Ec and low band offset of the conduction band Ev may be arranged on the lower side of external applied voltage of respective quantum dots 82a to 82e.

For example, when the second barrier layer 85 is formed with $In_{0.5}Ga_{0.5}P$, the band offset of the conduction band may be 0.1 eV, and the band offset of the valence band may be 0.5 eV. In that case, a band diagram shown in FIG. 30B may be obtained if the n type GaAs substrate may be used as the semiconductor substrate 80, and the $Al_{0.5}Ga_{0.5}As$ layer may be used as the semiconductor layer 81 serving as the first barrier layer, and the InAs dots may be used as the quantum dots 82a to 82e, and in addition the electrode 83 being Schottky-contacted to the semiconductor layer 81 may be formed of tungsten.

Figure 30B:
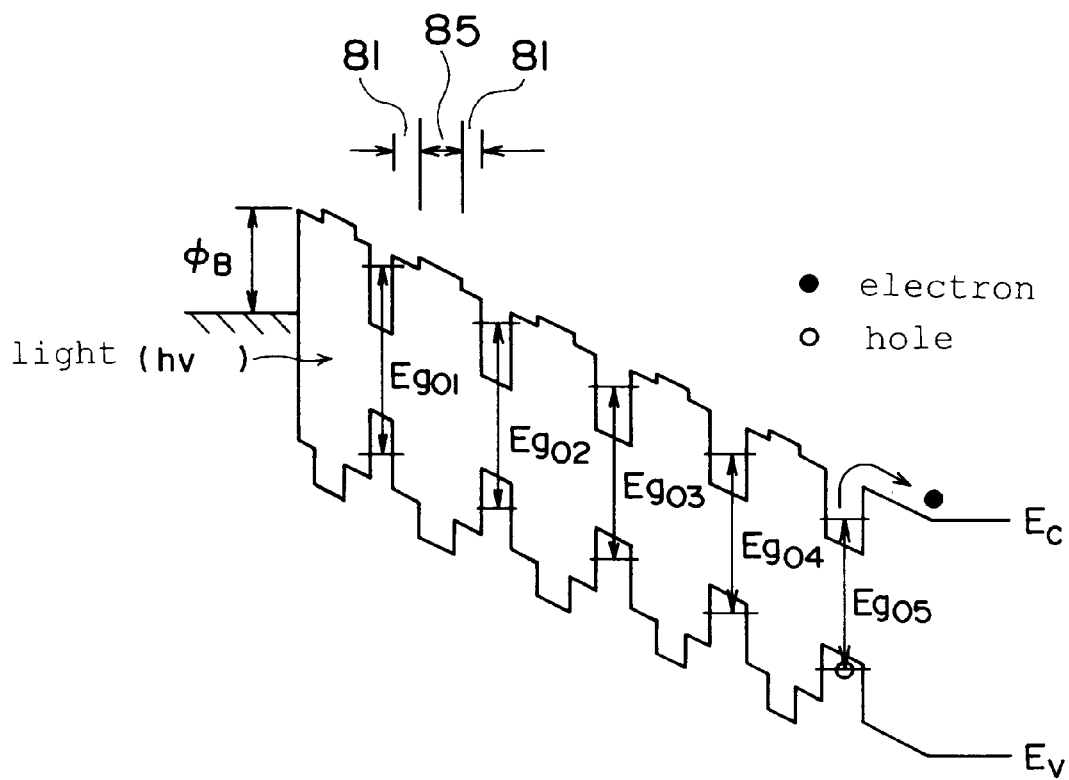
FIG. 30B is an energy band diagram of the optical semiconductor memory device in FIG. 30A.

As may be evident in FIG. 30B, holes remaining in the quantum dot 82a may stay there after creating the electron-hole pairs since tunneling of holes may be prevented by the second barrier layer 85. Therefore, other layers are never influenced by the remaining holes. Furthermore, since tunneling of electrons from the quantum dot 85a is not prevented, reading/writing information from/into the optical memory device can be facilitated.

It can be considered that wavelength-domain-multiplication memory may be provided in the form of the multilayered structure according to a seventeenth embodiment, wherein different information may be written into each layer. In this event, different reading/writing lights may be used in every layer.

In the structure mentioned, it should be assumed that, for example, a data "1" will be written into the memory region of the first layer, a data "0" will be written into the memory region of the second layer, and an electric field may be applied from the first layer toward the second layer. If the light must be irradiated to read information being written into the memory region of the second layer, the electrons may be emitted from the quantum dots in the memory region of the second layer to drift in the electric field. In that case, there is a possibility that the electrons would be recombined with holes in the quantum dots in the memory region of the first layer to eliminate information stored in the first layer. That is, there is also a possibility that loss of memory information occurs accompanying to carrier transportation between layers.

Subsequently, the seventeenth embodiment of the present invention will be explained along with respective manufacturing steps.

First, growth of the compound semiconductor of the wavelength-multiplication optical memory device will be explained with reference to FIG. 31A.

Figure 31A:
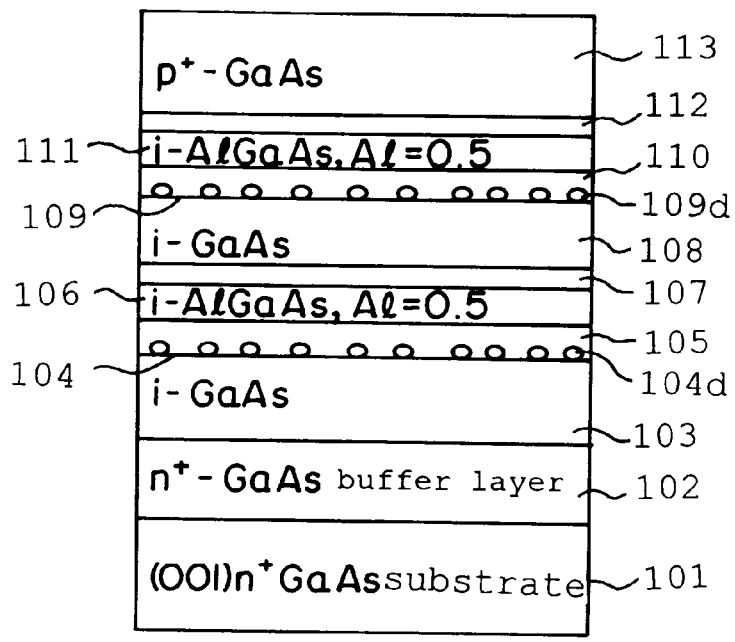
FIG. 31A is a sectional view showing a layer structure of an optical memory device according to a seventeenth embodiment of the present invention.

As shown in FIG. 31A, an n+ type GaAs buffer layer 102 of a 200 nm thickness, a first undoped GaAs layer 103 of a 300 nm thickness, and a first InAs layer 104 of a 1.8 monolayer (ML) thickness may be formed on a (001) face of an n+ type GaAs substrate 101. The first InAs layer 104 may be grown by molecular beam epitaxy (MBE), atomic layer epitaxy and the like at a temperature of 480° C. The atomic layer epitaxy may be defined as a method for growing multi-compound semiconductor film by exposing a substrate alternatively to growth atmospheres which include constituent atoms of the multi-compound semiconductor individually. A thickness of the atom layer may be represented by supply time of supplying the constituent elements to the surface of the substrate.

The first InAs layer 104 of a 1.8 ML thickness may be formed like a plurality of island-like quantum dots in a Stranski-Krastanow mode, which are present at random on the first undoped GaAs layer 103. These InAs quantum dots are referred to as "quantum dots 104d in the first layer" hereinafter.

Subsequently, a second undoped GaAs layer 105 of a 10 nm thickness may be formed to cover the quantum dots 104d in the first layer.

Then, a first energy barrier layer 106 formed of undoped $Al_{x1}Ga_{1-x1}As$ (x1=0.5) and of a 50 nm thickness, a low potential layer 107 formed of undoped $In_{x2}Ga_{1-x2}As$ (x2=0.05) and of a 20 nm thickness, and a third undoped GaAs layer 108 of a 200 nm thickness are formed on the second undoped GaAs layer 105. For the first energy barrier layer 106, such material should be selected which has potential energy larger than the value obtained by adding potential energy of GaAs to thermal energy kBT (kB is a constant, and T is absolute temperature). For the low potential layer 107, such material should be selected which has potential smaller than that of the third undoped GaAs layer 108 and smaller than that of the first energy barrier layer 106.

In turn, a second InGaAs layer 109 may be formed by MBE method etc. at a temperature of 480° C. to have a thickness of 1.8 ML. The second InGaAs layer 109 may be formed as a plurality of island-like quantum dots on the third undoped GaAs layer 108. These quantum dots are referred to as "quantum dots 109d in the second layer" hereinafter.

In addition, the quantum dots 109d in the second layer are covered with a fourth undoped GaAs layer 110 of a 10 nm film thickness. A second energy barrier layer 111 formed of undoped $Al_{x1}Ga_{1-x1}As$ (x1=0.5) is then formed to have a 50 nm thickness on the fourth undoped GaAs layer 110. For the second energy barrier layer 111, such material should be selected which has potential energy larger than the value obtained by adding potential energy of GaAs to thermal energy kBT.

In the next, a fifth undoped GaAs layer 112 of a 10 nm may be formed on the second energy barrier layer 111, followed by formation of a p+ type GaAs contact layer 113 of a 100 nm thickness.

Among the above compound semiconductor layers, the layers being not particularly mentioned are formed by an MBE method, an MOVPE method, etc.

Figure 31B:
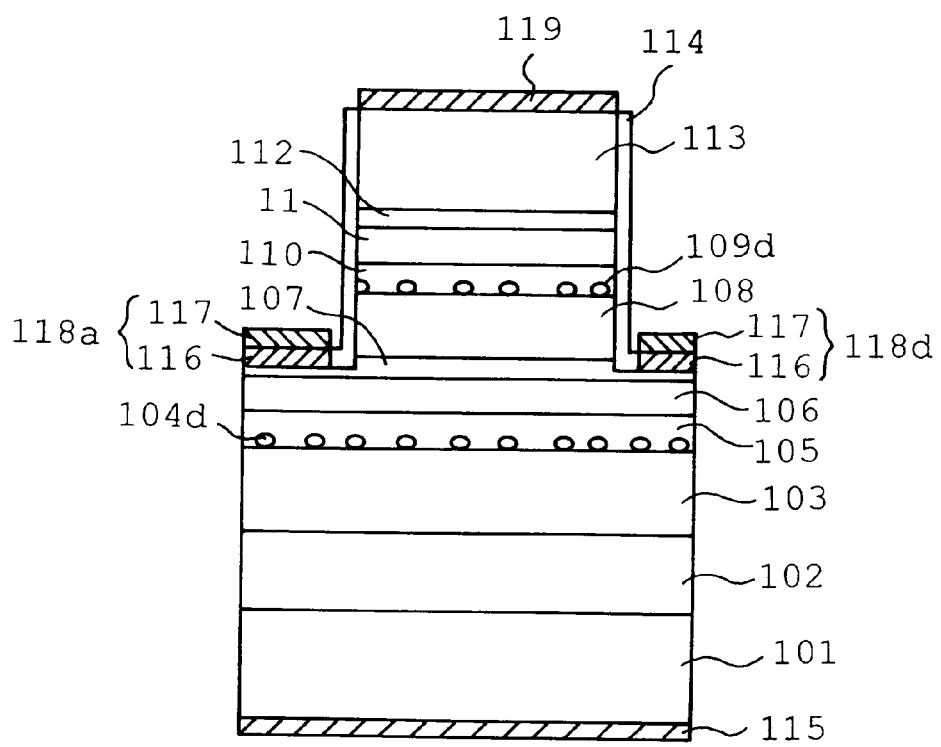
FIG. 31B is a sectional view showing a finished optical memory device according to the seventeenth embodiment of the present invention.
Figure 32:
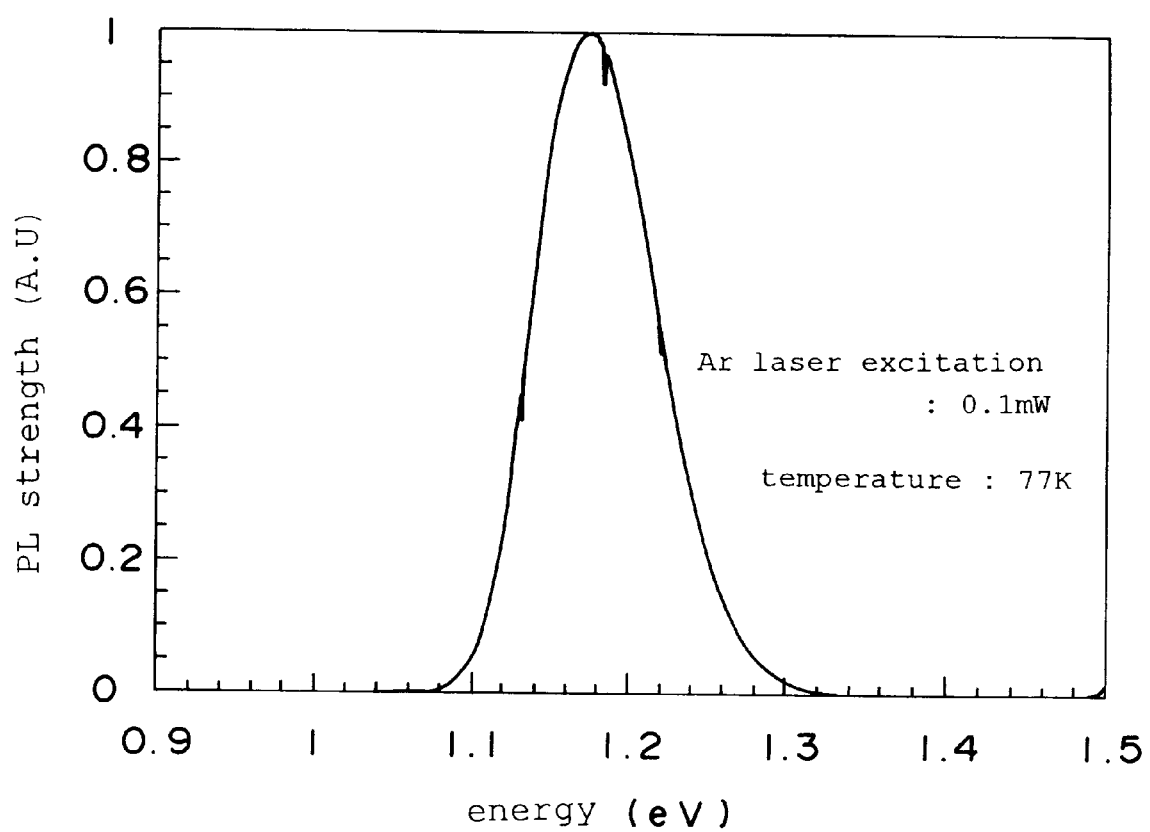
FIG. 32 is a view showing photoluminescence of quantum dots formed of InAs which being examined in terms of argon laser excitation of 0.1 mW at a temperature of 77 K.

After completing the growth of the above compound semiconductors, a device shown in FIG. 31B can be finished by patterning of the compound semiconductor layers and electrode formation.

First, the p+ type GaAs contact layer 113 to the low potential layer 107 may be patterned by photolithography to form a rectangular plane shape of size 1 mm×1 mm.

After patterning process, the protection film 114 formed of $SiO_2$ may be grown on the entire surface by low temperature CVD to cover exposure faces of respective layers.

Subsequently, an n side electrode 115 may be formed by using gold-tin (AuSn), indium (In), conductive paste, or the like on the bottom surface of the GaAs substrate 101.

Furthermore, a first opening portion and a second opening portion may be formed separately by patterning the protection film 114 to expose the low potential layer 107, and a third opening portion may be formed to expose the contact layer 113.

Subsequently, a gold-germanium (AuGe) layer 116 and an Au layer 117 may be evaporated consecutively, then a first electrode 118a may be formed in the first opening portion and a second electrode 118b may be formed in the second opening portion, with remaining the Au layer 117 and the AuGe layer 116 on both sides of the low energy layer 7. The AuGe layer 116 and the Au layer 117 may be patterned by means of a lift-off method or by photolithography.

Then, the AuGe layer 116 and the low potential layer 107 may be alloyed by heat treatment for five minutes at a temperature of 400° C. in the nitrogen atmosphere.

Thereafter, an Au layer may be formed to have a 30 nm thickness on the contact layer 113, then a p side electrode 119 may be formed by patterning the Au layer. A thin Au such as 30 nm thickness can pass through the light, so the p side electrode 119 can transmit the light. The Au layer may be patterned by the lift-off method or by photolithography.

With the above processes, the basic structure of the wavelength multiplication optical memory device has been completed.

The quantum dot 104d of the first layer existing between the first GaAs layer 103 and the second GaAs layer 105 and the quantum dot 109d of the second layer existing between the third GaAs layer 108 and the fourth GaAs layer 110 may be formed respectively in a Stranski-Krastanow mode.

Their FWHMs are extremely large in contrast to two-dimensional quantum well layer, and as shown in FIG. 2 broad light generation having a peak near 1.17 eV can be measured. In other words, because fluctuations of the sizes of a plurality of quantum dots 104d, 109d occur, different energy between quantum levels of holes and electrons may exist. If the wavelength band becomes wider, an information amount of the memory, i.e., wavelength band of the light usable for reading/writing of the memory, may be increased.

Since the quantum dots 104d of the first layer and the quantum dots 109d of the second layer have been formed under the same condition, there are many quantum dots having the same energy between ground states, i.e., the same transition energy. However, since transition energy is different in accordance with fluctuations of the sizes, there exist quantum dots having transition respective energy in the quantum dot 104d of the first layer and the quantum dot 109d of the second layer.

Next, reading/writing of information from/into the foregoing wavelength multiplication optical memory device will be explained hereinafter.

Figure 33:
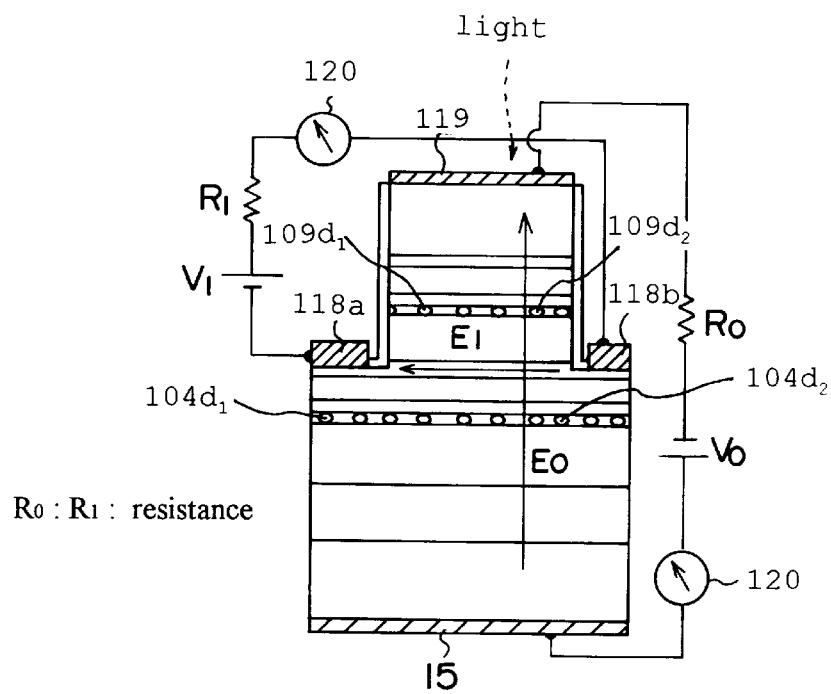
FIG. 33 is a constitutional view showing a wiring connection of the optical memory device according to the seventeenth embodiment of the present invention.

As shown in FIG. 33, the backward bias voltage Vo may be applied between the P+ type GaAs contact layer 113 and the n+ type GaAs substrate 101 to thus generate electric field $E_0$ in the film growth direction (film thickness direction). Thereby, current hardly flows in the film thickness direction except for reading/writing time of information.

It would be important that, under the condition that holes remain in the quantum dot 104d and the quantum dot 109d, the voltage $V_0$ should be applied not to exceed confinement energy of holes. This is because write information will be changed if holes are emitted from the quantum dots.

Then voltage V, may be applied between the first electrode 118a and the second electrode 118b on both sides of the low potential layer 107 to thus generate electric field $E_1$ in the surface direction (direction perpendicular to the film thickness) of the low potential layer 107.

Figure 34:
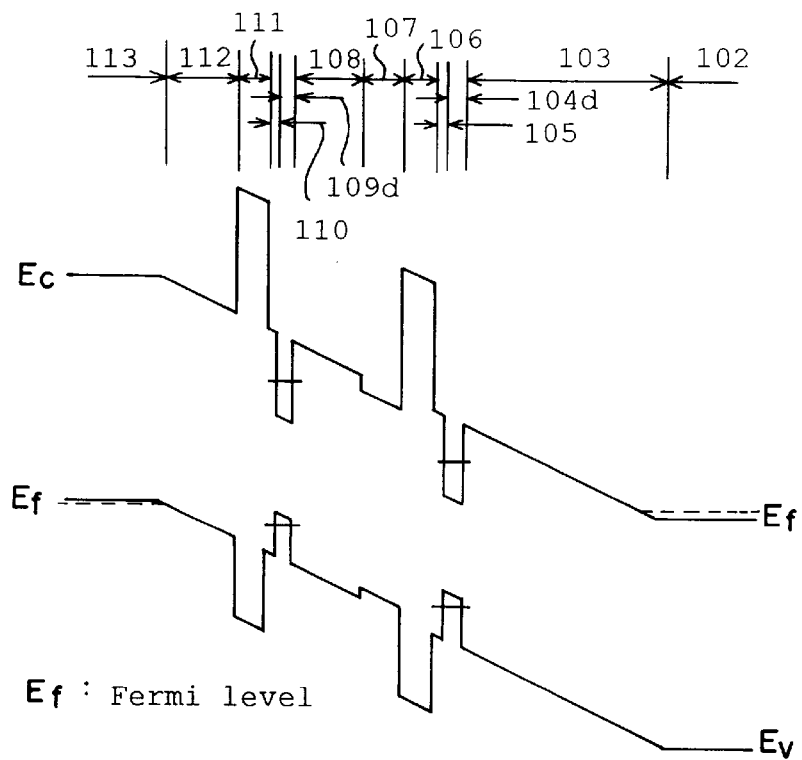
FIG. 34 is a schematic view showing an energy band structure of the optical memory device according to the seventeenth embodiment of the present invention.

In this state, an energy band of the wavelength multiplication optical memory device is shown in FIG. 34. It should be assumed that the transition energy of the quantum dot 104d of the first layer is $Eg_1$, and the transition energy of the quantum dot 109d of the second layer is $Eg_2$.

Writing of information into the quantum dots is as follows.

As shown in FIG. 33, if the light of energy 1.17 eV is irradiated into the memory device via the transparent p side electrode 119, the light may be absorbed in the quantum dot 104d1 of the first layer and the quantum dot 109d1 of the second layer, both having transition energy of 1.17 eV, to create the electron-hole pairs. As a result, the electrons may be emitted to the outside by tunneling effect, etc. to drift in electric field $E_0$. Thus, a data "1" may be written into the quantum dot 104d1 of the first layer and the quantum dot 109d2 of the second layer, both having transition energy of 1.17 eV. On the contrary, a data "0" may be written into the quantum dot 104d2 of the first layer and the quantum dot 109d2 of the second layer, both having transition energy of 1.16 eV, without irradiating the light of energy 1.16 eV.

Figure 35A:
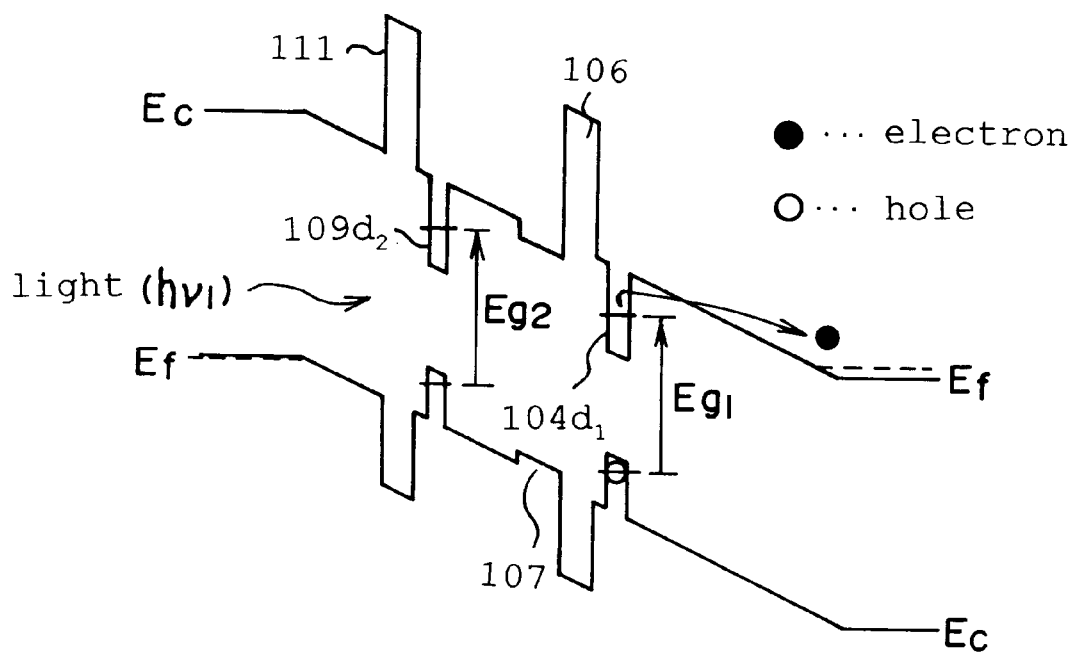
FIGS. 35A and 35B are views respectively showing an energy band structure of the optical memory device according to the seventeenth embodiment of the present invention.
Figure 35B:
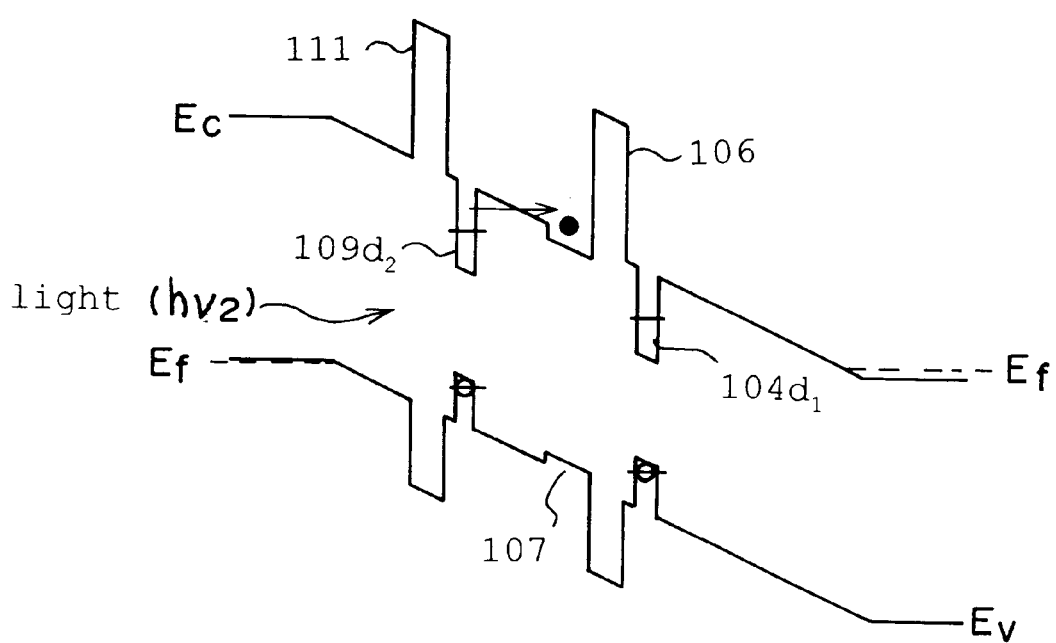

The energy band diagram for writing operation is shown in FIG. 35A. In FIGS. 35A and 35B, for easy understanding, the quantum dot 104d2 of the first layer having transition energy of *1.16* eV and the quantum dot 109d1 of the second layer having transition energy of 1.17 eV have been omitted.

In this state, information stored in the quantum dots may be read as follows.

To read information stored in the quantum dots 104d2, 109d2 having transition energy of 1.16 eV, if the light having transition energy of 1.16 eV will be irradiated from the p side electrode 119, the hole-electron pairs may be created in the quantum dot 104d2 of the first layer having transition energy of 1.16 eV and the quantum dot 109d2 of the second layer having transition energy of 1.16 eV, and the electrons are released therefrom. This reading can be shown in the energy band diagram of FIG. 35B.

Since the electrons may be moved by electric field $E_0$ in the film thickness direction but injection of the electrons into the quantum dot 104d1 of the first layer having transition energy of 1.17 eV may be blocked by the first energy barrier layer 106, crosstalk between the quantum dots can be prevented.

The electrons the transition of which being blocked by the first energy barrier layer 106 may come to the low potential layer 107 and be collected effected there, and in addition may be drifted from the first electrode 118a to the second electrode 118b by electric field $E_1$ in the surface direction of the low potential layer 107. Therefore, the current value of a current detector 120 connected to the first and second electrodes 118a, 118b may be increased. It can be decided according to change in the current value that information "0" has been written into the quantum dots 104d2, 109d2 having transition energy of 1.16 eV.

The electrons being emitted from the first quantum dot 104d2 having transition energy of 1.16 eV by light irradiation may be drifted to the GaAs substrate 101 by electric field $E_0$ applied between the p side electrode 119 and the n side electrode 115. Therefore, the current value passing through the current detector 120 which is connected to the p side electrode 119 and the n side electrode 115 may be increased.

In the quantum dot 104d2 having transition energy larger than 1.16 eV, information would not be rewritten because the hole-electron pairs are not created by irradiation of the light having energy of 1.16 eV.

As aforementioned, if the energy barrier having potential larger than thermal energy kBT has been formed in the quantum dots on the opposite side to the electron drifting direction, the electrons drifted by electric field may be prevented by the energy barrier layer from being injected into the quantum dots.

In the embodiment, by the way, in case transition energy $Eg_1$, $Eg_2$ of the quantum dots 104d of the first layer and the quantum dot 109d of the second layer are identical to each other, reading output current may be enhanced since the number of electrons are increased at the time of reading information.

On the other hand, in case transition energy $Eg_1$, $Eg_2$ are different, crosstalk can be prevented since the electrons emitted from the quantum dot 109d of the second layer may be blocked by the first energy barrier layer 106 from being injected into the quantum dots 104d of the first layer.

But in the event that the light is not irradiated, there is no case wherein information written into the second quantum wells 109d may evaporate since the electrons supplied from the contact layer 113 can be prevented by the second energy barrier layer 111 from being injected into the second quantum wells 109d.

In addition, if a positive bias voltage is applied between the p side electrode 119 and the n side electrode 115 to refresh information stored in the wavelength multiplication memory device, the electrons may be supplied from the side without the energy barrier layers 106, 111 into the quantum dots 104d, 109d to recombine with the holes in the quantum dots 104d, 109d. Therefore, information in all quantum dots 104d, 109d may be changed to "0".

In the foregoing wavelength-domain-multiplication memory device, the low potential layer 107 adjacent to the first energy barrier layer 106 may be omitted. In such structure, the electron transition of which can be suppressed by the first energy barrier layer 106 may be moved in the third GaAs layer 108 by electric field applied in the lateral direction.

As to the quantum dots 104d, 109d of the first and second layers, the quantum dot structure including the barrier layer may be formed like a periodically stacked multilayer structure.

In the foregoing wavelength-domain-multiplication memory device, the embodiment in which the two-layered InAs quantum dots are formed in the film thickness direction has been explained. In the eighteenth embodiment, a wavelength-domain-multiplication memory device wherein the quantum dots of the first layer and the quantum dots of the second layer may be formed with different materials will be explained.

Figure 36A:
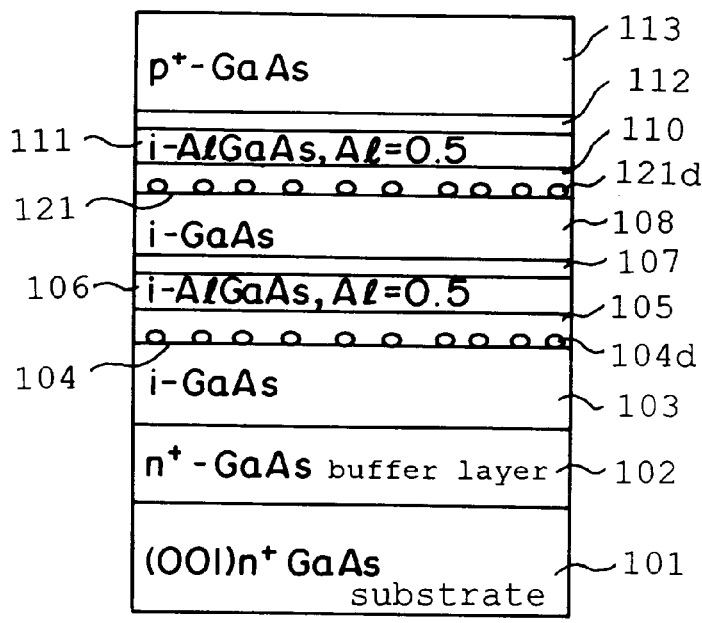
FIG. 36A is a sectional view showing a layer structure of an optical memory device according to an eighteenth embodiment of the present invention.

First, growth of the compound semiconductor of the wavelength-multiplication optical memory device will be explained with reference to FIG. 36A. In FIG. 36A, like reference symbols in FIG. 31A identify like elements.

In the eighteenth embodiment, like the seventeenth embodiment, an n+ type GaAs buffer layer 102, a first undoped GaAs layer 103, quantum dots 104d of a first InAs layer, a second undoped GaAs layer 105, a first energy barrier layer 106 formed of undoped $Al_{x1}Ga_{1-x1}As$, a low potential layer 107 formed of undoped $In_{x2}Ga_{1-x2}As$, and a third undoped GaAs layer 108 may be formed in order on a (001) face of an n+ type GaAs substrate 101.

Following to the growth of the compound semiconductor, an $In_{x3}Ga_{1-x3}As$ (x3=0.5) layer 121 may be formed by MBE and the like to have a 5 ML thickness. The $In_{x3}Ga_{1-x3}As$ layer 121 may be a plurality of quantum dots 121d in a Stranski-Krastanow mode on the third undoped GaAs layer 108. The quantum dots 121d may be regarded as the quantum dots in the second layer.

After this, the quantum dots 121d in the second layer is covered with a fourth undoped GaAs layer 110 of a 10 nm film thickness. Like the seventeenth embodiment, a second energy barrier layer 111 formed of undoped $Al_{x1}Ga_{1-x1}As$ (x1=0.5), a fifth undoped GaAs layer 112, and a p+ type GaAs contact layer 113 are formed on the fourth undoped GaAs layer 110. Thicknesses and composition ratios of these layers 111 to 113 are identical to those in the seventeenth embodiment.

When photoluminescence of the sample having the structure as above has been measured at 77 K, broad light generation having a peak near 1.17 eV has been measured for the quantum dots in the first layer formed of InAs, and also broad light generation having a peak near 1.2 eV has been measured the quantum dots in the second layer formed of InGaAs.

The above compound semiconductor layers may be formed by MBE method, etc.

After completing the growth of the above compound semiconductors, as in the seventeenth embodiment, the p+ type GaAs contact layer 113 to the low potential layer 107 may be patterned by photolithography to form a rectangular plane shape with a size of 1 mm×1 mm.

After the patterning process, the protection film 114 formed of $SiO_2$ may be grown on the entire surface to cover exposure faces of respective layers.

Figure 36B:
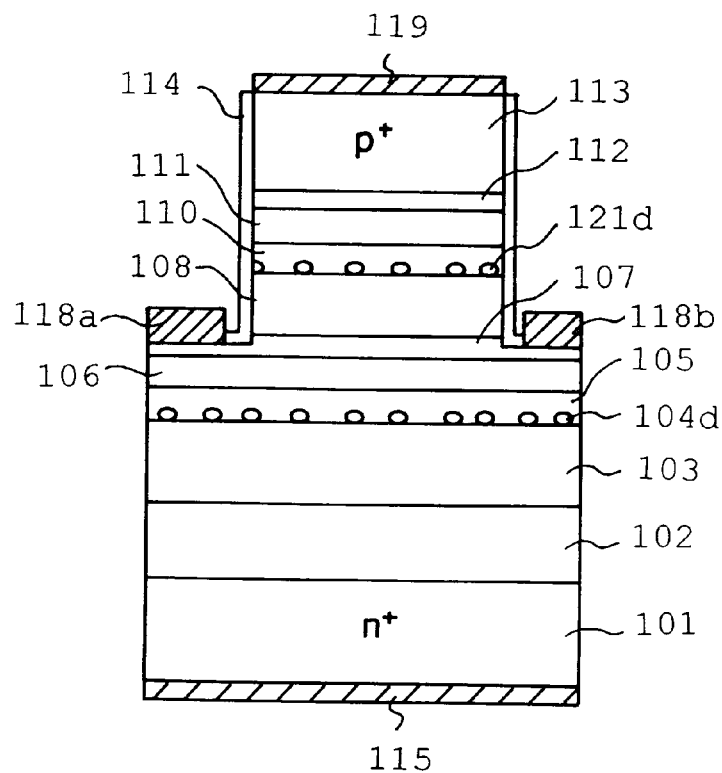
FIG. 36B is a sectional view showing a finished optical memory device according to the eighteenth embodiment of the present invention.

Subsequently, as shown in FIG. 36B, like the seventeenth embodiment, an n side electrode 115 may be formed on the bottom surface of the GaAs substrate 101. A first electrode 118a and a second electrode 118b may be formed on both sides of the low energy layer 107. A p side electrode 119 may be formed on the contact layer 113.

With the above processes, the basic structure of the wavelength multiplication optical memory device has been completed.

Figure 37:
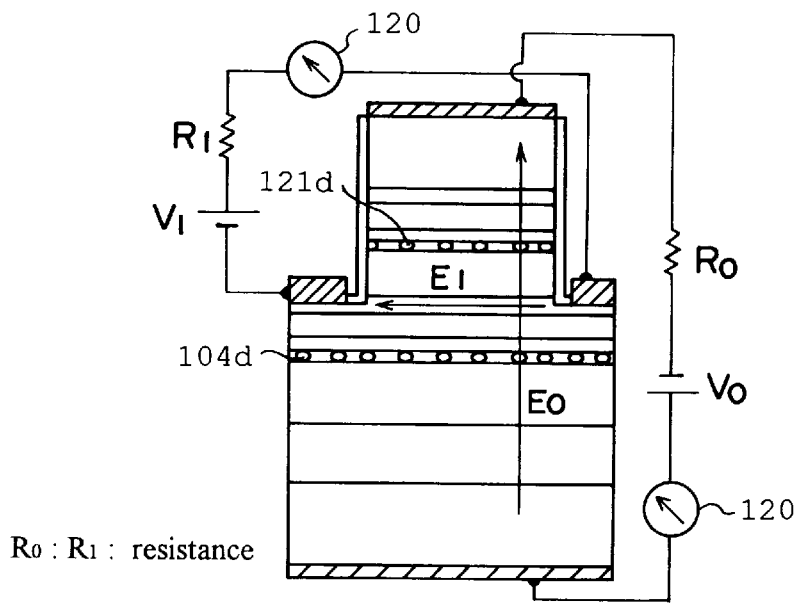
FIG. 37 is a schematic sectional view showing a wiring connection of the optical memory device according to the eighteenth embodiment of the present invention.

In this wavelength multiplication optical memory device, as shown in FIG. 37, the backward bias voltage Vo may be applied between the P+ type GaAs contact layer 113 and the n+ type GaAs substrate 101 to thus generate electric field $E_0$ in the film growth direction (film thickness direction).

Thereby, current may hardly flow in the film thickness direction except for reading/writing time of information.

The voltage $V_0$ should be applied not to exceed the confinement energy of holes in the quantum dots 104d, 121d.

The voltage $V_1$ may also be applied between the first electrode 118a and the second electrode 118b on both sides of the low potential layer 107 to thus produce electric field $E_1$ in the surface direction (direction perpendicular to the film thickness) of the low potential layer 107.

Figure 38:
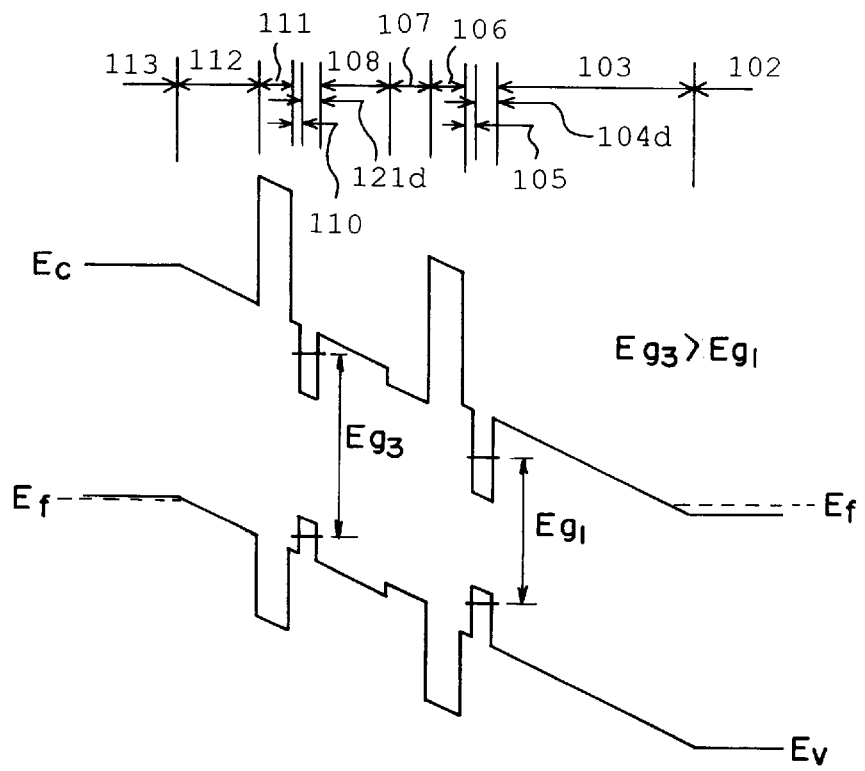
FIG. 38 is a schematic view showing an energy band structure of the optical memory device according to the eighteenth embodiment of the present invention.

In this state, energy band of the wavelength multiplication optical memory device is shown in FIG. 38. It should be assumed that the transition energy of the quantum dot 104d of the first layer is $Eg_1$, and the transition energy of the quantum dot 121d of the second layer is $Eg_2$. Since the transition energy $Eg_1$ of the quantum dot 104d of the first layer and the transition energy $Eg_2$ of the quantum dot 121d of the second layer are different, the light used for reading/writing is also different.

In this case, when effecting read/write of information, the electrons being emitted from the quantum dot 121d of the second layer may be moved by electric field $E_0$ in the film thickness direction, but injection of the electrons into the quantum dot 104d1 of the first layer, wherein data "1" has been written, may be blocked by the first energy barrier layer 106. As a result, the wavelength-multiplication optical memory device without crosstalk between the quantum dots can be achieved.

The electrons the transition of which being blocked by the first energy barrier layer 106 may be moved in the low potential layer 107 by potential difference $V_1$ between the first electrode 118a and the second electrode 118b. Therefore, current value between the first electrodes 118a and the second electrodes 118a may be varied.

In the aforementioned wavelength-domain-multiplication memory devices, the layers other than the quantum dots, the low potential layer, and the energy barrier layer have been formed with the same material as the substrate. However, the present invention is not limited to such layer structure, and may be formed such a layer structure wherein the energy barrier may be formed adjacent to the substrate or the contact layer. In the nineteenth embodiment, the wavelength-multiplication memory device having such layer structure will be explained hereinafter.

Figure 39A:
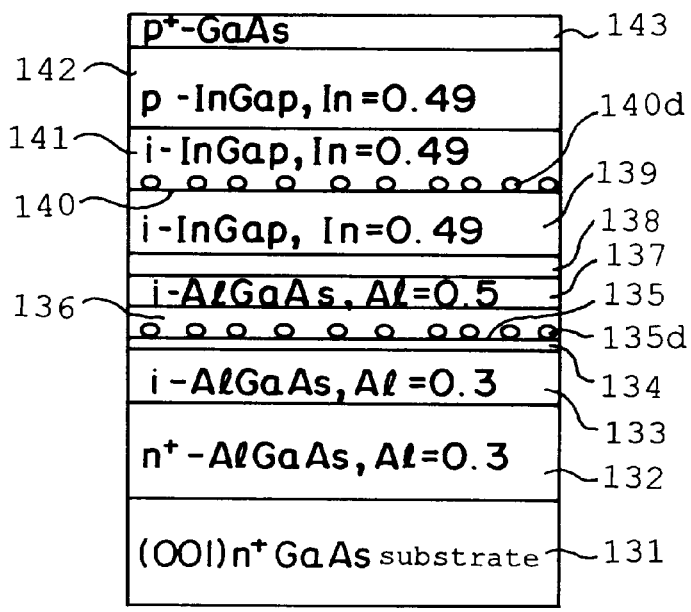
FIG. 39A is a sectional view showing sectional view showing a layer structure of an optical memory device according to a nineteenth embodiment of the present invention.

Growth of the compound semiconductor of the wavelength-multiplication optical memory device will be explained with reference to FIG. 39A.

First, an n+ type $Al_{x4}Ga_{1-x4}As$ (x4=0.3) buffer layer 132 of a 300 nm thickness is formed on a (001) face of an n+ type GaAs substrate 131. A first energy barrier layer 133 formed of undoped $Al_{x4}Ga_{1-x4}As$ (x4=0.3) and of a 100 nm thickness, and a first undoped GaAs layer 134 of a 2 nm thickness are formed in sequence on the buffer layer 132.

Then, an InAs layer 135 of a 1.8 ML thickness may be formed on the first undoped GaAs layer 134. The InAs layer 135 may be grown by MBE, atomic layer epitaxy, or the like at a temperature of 480° C. The InAs layer 135 of a 1.8 ML thickness may be formed like a plurality of island-like quantum dots in a Stranski-Krastanow mode, which are present at random on the first undoped GaAs layer 134. These InAs quantum dots are referred to as "quantum dots 135d in the first layer" hereinafter.

Subsequently, a second undoped GaAs layer 136 of a 5 nm thickness may be formed to cover the quantum dots 135d in the first layer.

Thereafter, a second energy barrier layer 137 formed of undoped $Al_{x5}Ga_{1-x5}As$ (x5=0.5) and of a 50 nm thickness, a third energy barrier layer 138 formed of undoped $Al_{x6}Ga_{1-x6}As$ (x6=0.25) and of a 20 nm thickness, and a fourth energy barrier layer 139 formed of undoped $In_{y1}Ga_{1-y1}P$ (y1=o.49) and of a 200 nm thickness are formed on the second undoped GaAs layer 136.

In turn, an InP layer 140 may be formed to have a thickness of 7 ML by MBE method etc. at a temperature of 480° C. on the fourth energy barrier layer 139. The InP layer 140 having a 7 ML thickness may be formed at random as a plurality of island-like quantum dots on the fourth energy barrier layer 139. These quantum dots are referred to as "quantum dots 140d in the second layer" hereinafter.

In addition, the quantum dots 140d in the second layer may be covered with a fifth energy barrier layer 141 formed of undoped $In_{y2}Ga_{1-y2}P$ (y2=0.49) and of a 50 nm film thickness. Then a sixth energy barrier layer 142 formed of p+ type $In_{y3}Ga_{1-y3}P$ (y3=0.49) may be formed to have a 100 nm thickness on the fifth energy barrier layer 141.

Finally, the sixth energy barrier layer 142 may be covered with a p+ type GaAs contact layer 143 of a 50 nm thickness.

For the first to sixth energy barrier layers 133, 137, 138, 139, 141, and 142, such material should be selected which has potential energy larger than the value obtained by adding potential energy of GaAs to thermal energy kBT.

With the above processes, the basic layer structure of the wavelength multiplication optical memory device has been completed.

When photoluminescence of the sample having the structure as above has been measured at 77 K, broad light generation having a peak near 1.3 eV has been measured for the quantum dots 135d in the first layer formed of InAs, and also broad light generation having a peak near 1.7 eV has been measured the quantum dots 140d in the second layer formed of InGaAs.

The above compound semiconductor layers are formed by the MBE method, etc.

After completing the growth of the above compound semiconductors, a device shown in FIG. 31B can be finished by patterning of the compound semiconductor layers and forming electrodes.

After the growth of the above compound semiconductors has been completed, like the seventeenth embodiment, the contact layer 143 to the third energy barrier layer 138 may be patterned by photolithography to form a rectangular plane shape with a size of 1 mm×1 mm.

After the patterning process, the protection film 144 formed of $SiO_2$ may be grown on the entire surface by low temperature CVD to cover exposure faces of respective layers.

Figure 39B:
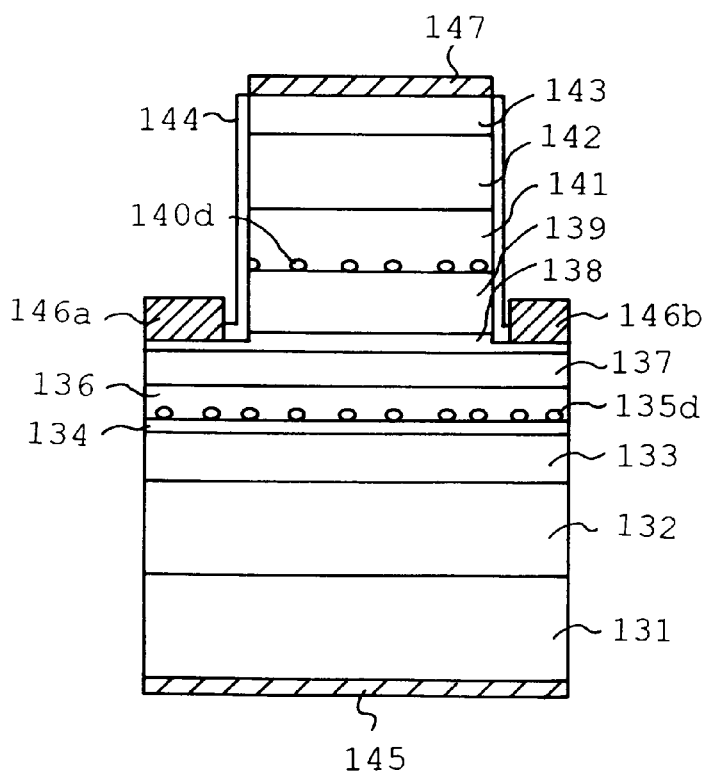
FIG. 39B is a sectional view showing a finished optical memory device according to the nineteenth embodiment of the present invention.

Subsequently, as shown in FIG. 39B, an n side electrode 145 may be formed on the bottom surface of the GaAs substrate 131. A first electrode 146a and a second electrode 146b may be connected to right and left sides of the third energy barrier layer 138 via openings in the protection film 144d. Then, the first and second electrodes 146a and 146b and the third energy barrier layer 138 may be alloyed by heat treatment for five minutes at a temperature of 400° C. in the nitrogen atmosphere. Subsequently, a p side electrode 147 having light transmittance may be formed on the contact layer 143. Materials and film thicknesses are the same as those in the seventeenth embodiment.

With the above processes, the basic structure of the wavelength multiplication optical memory device has been completed.

Figure 40:
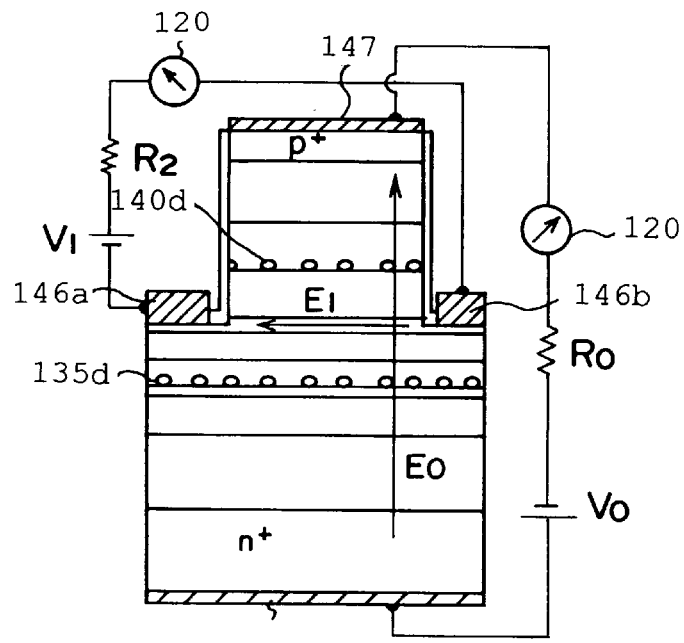
FIG. 40 is a constitutional view showing a wiring connection of the optical memory device according to a nineteenth embodiment of the present invention.

In this wavelength multiplication optical memory device, as shown in FIG. 40, the backward bias voltage Vo may be applied between the contact layer 143 and the GaAs substrate 131 to thus produce electric field $E_0$ in the film growth direction (film thickness direction). Thereby, current may hardly flow in the film thickness direction except for reading/writing time of information. The voltage $V_0$ should be applied not to exceed the confinement energy of holes in the quantum dots 135d, 140d.

Then voltage $V_1$ may be applied between the first electrode 146a and the second electrode 146b on both sides of the third energy barrier layer 138 to thus produce electric field $E_1$ in the surface direction (direction perpendicular to the film thickness) of the third energy barrier layer 138.

Figure 41:
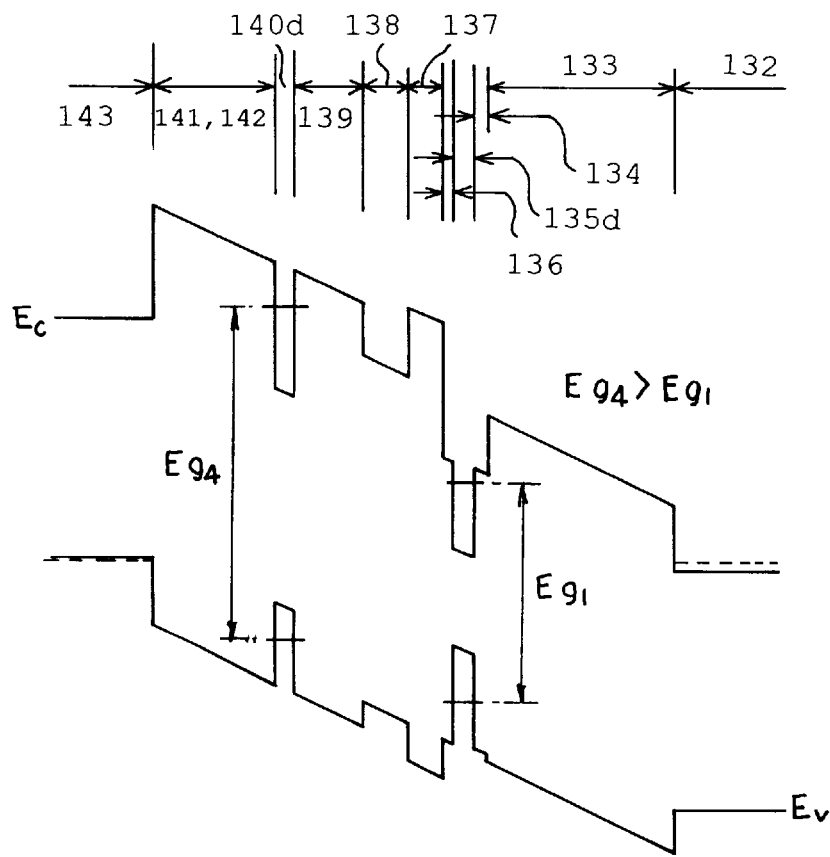
FIG. 41 is a schematic view showing an energy band structure of the optical memory device according to the nineteenth embodiment of the present invention.

In this state, energy band of the wavelength multiplication optical memory device is shown in FIG. 41. It should be assumed that the transition energy of the quantum dot 135d of the first layer is $Eg_1$, and the transition energy of the quantum dot 140d of the second layer is $Eg_2$. Since the transition energy $Eg_1$, $Eg_2$ of the quantum dot 135d of the first layer and the quantum dot 140d of the second layer are different, wavelength of the light for use in reading/ writing may also different.

In this case, like the seventeenth embodiment, when reading/writing information, the electrons emitted from the quantum dots 140d of the second layer may be moved by electric field $E_0$ in the film thickness direction, but injection of the electrons into the quantum dot 135d of the first layer wherein data "1" has been written may be blocked by the second energy barrier layer 137. As a result, the wavelength multiplication optical memory device without crosstalk between the quantum dots may be practical in use.

The electrons the transition of which being blocked by the second energy barrier layer 137 may be injected into the third energy barrier layer 138 which is in lower potential than the fourth energy barrier layer 139, and then may be drifted by voltage difference $V_1$ between the first electrodes 118a and second electrodes 118b. Therefore, the current value between the first electrodes 118a and second electrodes 118b may be changed.

On the contrary, when reading/writing information, the electrons being emitted from the quantum dot 135d of the first layer may be drifted by voltage difference $V_0$ between the p side electrode 147 and the n side electrode 145 and passed through the p side electrode 119 and the n side electrode 115. Therefore, the current value passing through the p side electrode 147 and the n side electrode 145 may be changed.

In the nineteenth embodiment, since the energy barrier layers have been arranged on the GaAs substrate 131 side and the contact layer 143 side of the quantum dots 135d, 140d, there is no possibility the electrons are injected from the GaAs substrate 131 and the contact layer 143. Therefore, a positive bias voltage may be used as the voltage applied between the p side electrode 147 and the n side electrode 145.

In the foregoing embodiments, it would be preferable for the substrate and the buffer layer formed thereon to be formed with material having the same lattice constant. However, if their lattice constants are different, material of the substrate and the buffer layer must be selected not to cause dislocation in the crystal.

In the compound semiconductor constituting the quantum dots, it is indispensable to form the quantum dots on the base compound semiconductor layer having large bandgap to be self-organized, and in addition it is preferable that the lattice constant of quantum dot material is significantly different than that of the base compound semiconductor layer material.

Moreover, energy bandgap of the compound semiconductor layer constituting the quantum dots of the first layer may be equal to or less than that of the compound semiconductor layer constituting the quantum dots of the second layer.

Figure 42:
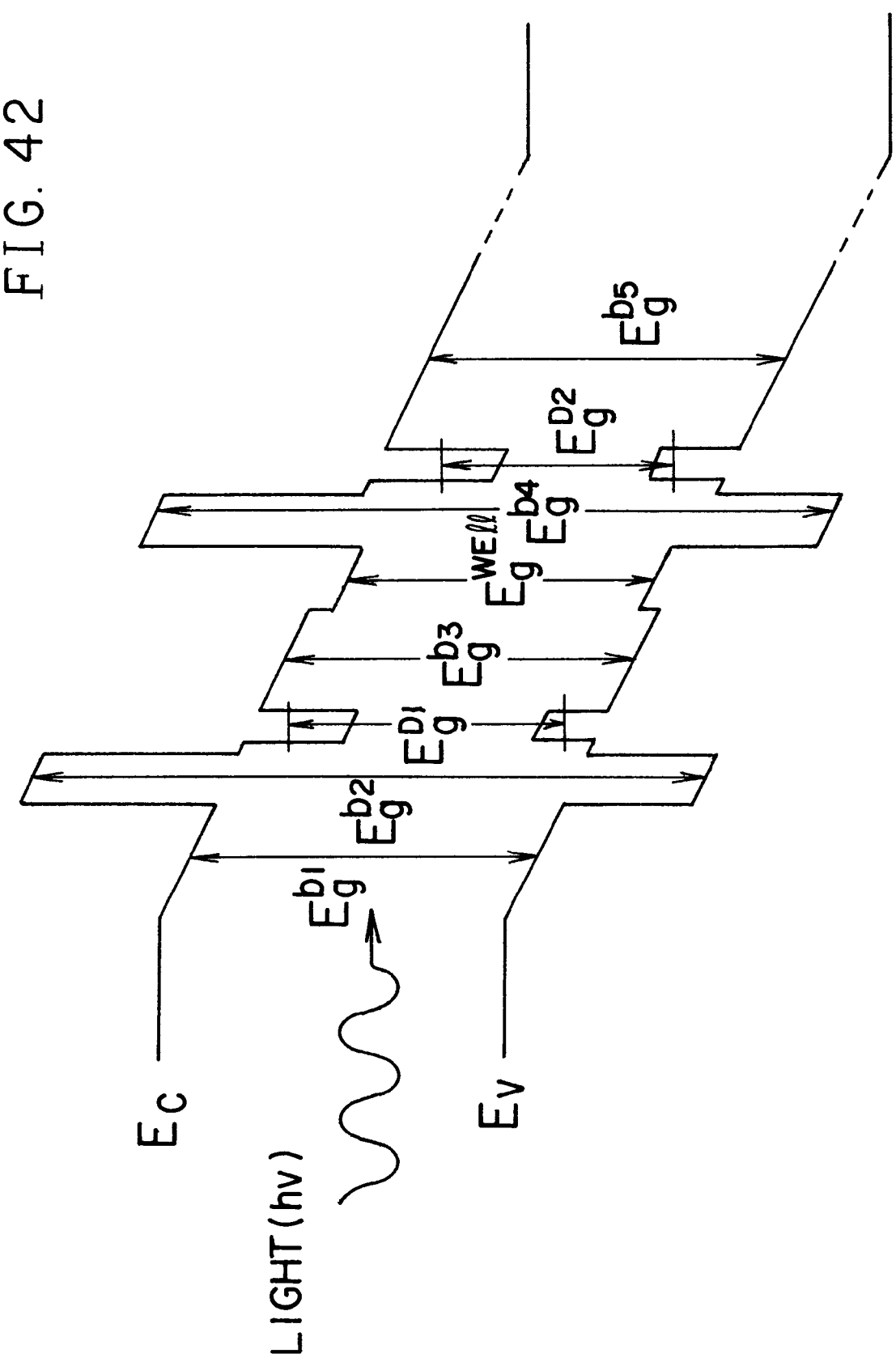
FIG. 42 is a view showing a principle energy band structure of the optical memory device according to the present invention.

Typical energy bandgap of the above embodiments is illustrated in FIG. 42.

In FIG. 42, the quantum dots may be formed in respective layers, and the energy barrier layer which has higher potential than thermal energy of the compound semiconductor layer surrounding the quantum dots may be formed on the upstream side of electron flow from the quantum dots. Further, the low potential layer which has lower potential than thermal energy of the compound semiconductor layer surrounding the quantum dots may be formed on the higher potential side of the energy barrier layer.

In this event, condition between energy bandgap $Eg^{b(2n+1)}$ of compound semiconductor surrounding the quantum dots, transition energy $Eg^{Dn}$ of dots, energy bandgap $Eg^{b2n}$ of energy bap layer, energy bandgap $Eg^{well}$ of low potential layer can be expressed by equation (1).

Transition energy $Eg^{Dj}$ of quantum dot would be larger than transition energy $Eg^{DK}$ of other quantum dots which reside in the electron transition direction (Dj<Dk). In this case, in order to protect written information, information writing operation to the quantum dots must be executed from the nearer side of the light source, i.e., in the order of larger side of the transition energy. To prevent destruction of information, the information reading operation from the quantum dots must be executed from the farther side of the light source, i.e., in the order of smaller side of the transition energy.

Incidentally, numerals and symbols attached to Eg indicate the stack order of the compound semiconductors, not multipliers.

(Equation 1)

$$E_g^{D1}, E_g^{D2}, \ldots, E_g^{Da} < E_g^{well} \leq E_g^{b1}, E_g^{b3}, E_g^{b5}, \ldots, E_g^{b2a+1} < E_g^{b2},$$
$$E_g^{b4}, \ldots, E_g^{b2a}\ E_g^{Dj} \leq E_g^{Dk},\ j \neq k \qquad (1)$$

According to foregoing descriptions, only such structures have been explained that the electrons may be emitted from the quantum dots by light irradiation. However, by shallowing the wells on the valence band side of the quantum dots and together with by deeping the wells on the conduction band side, the holes may be emitted by light irradiation to fix the electrons. In this case, the energy barrier layer may be formed on the lower potential side of the quantum dots.

In case such a structure should be adopted wherein the energy barrier layer may be arranged on the GaAs substrate side against the quantum dots, the positive bias voltage must be applied between the n side electrode and the p side electrode to refresh the memory.

In the above embodiments, as materials of the quantum dots and the semiconductor layer around the quantum dots, either of group III-V semiconductor, group II-IV semiconductor, Si, Ge, SiGe, etc. may be utilized, and therefore descriptions of the above embodiments should not be interpreted restrictively.

Not only the above optical semiconductor memory devices but also switching devices working as their peripheral circuits are indispensable to form the optical semiconductor memory integrated circuit. In the above-discussed optical semiconductor memory devices, there are some devices capable of serving as the switching device unless the light is not irradiated to the semiconductor layer including the quantum dots. It would be understood that, if such devices are used as the function of the switching device, the light shielding film may be formed on the semiconductor layer including the quantum dots therein. For instance, the light shielding film may be formed at a location shown by a dot-dash line on the semiconductor layer 17 the device as shown in FIG. 9, and thus the device may be used as an ordinary bipolar transistor.

What is claimed is:

1. An optical memory device comprising:
   (a) semiconductor device including
      (1) a first layer made of a first semiconductor including first conductive type impurities,
      (2) a carrier barrier semiconductor layer formed on said first layer, said carrier barrier semiconductor layer which is undoped,
      (3) quantum dots formed in said carrier barrier semiconductor layer, and
      (4) a second layer formed on said carrier barrier semiconductor layer, said second layer being made of a second semiconductor including second conductive type impurities or a Schottky barrier metal; said optical memory device further comprising
   (b) backward bias voltage providing means which provide backward bias voltage between said first layer and said second layer;
   (c) writing means for irradiating a light to said quantum dots; and
   (d) reading means which distinguish "1" or "0" by measuring a quantity of light transmitted from said quantum dots in a reading operation or by measuring a quantity of current between said first layer and second layer in the reading operation.

2. An optical semiconductor memory device as claimed in claim 1, wherein said carrier barrier semiconductor layer is formed on parts of a plurality of active devices, and said carrier barrier semiconductor layer on a few of said active devices is covered with a light shielding film.

3. An optical memory device as claimed in claim 1, wherein said quantum dots consist of a plurality of quantum dots having different size than each other.

4. An optical memory device as claimed in claim 1, wherein said carrier barrier semiconductor layer is made of an undoped semiconductor or semiconductor containing a second conductivity type impurity.

5. An optical memory device as claimed in claim 1, wherein ground quantum level of conduction bands of said quantum dots are separated from conduction band edge of said first semiconductor layer in respect of energy.

6. An optical memory device as claimed in claim 1, further comprising a third layer made of undoped semiconductor and formed between said first layer and said carrier barrier semiconductor layer.

7. An optical memory device as claimed in claim 1, wherein said first layer is a channel layer of a field-effect transistor.

8. An optical memory device as claimed in claim 1, wherein said carrier barrier semiconductor layer constitutes an emitter layer or a base layer of a bipolar transistor.

9. An optical memory device as claimed in claim 8, wherein an energy bandgap of a collector layer of said bipolar transistor is smaller than energy difference between ground levels of said conduction band and said valence band of said quantum dots.

10. An optical memory device as claimed in claim 8, further comprising an undoped semiconductor layer being formed between a collector layer and said base layer of said bipolar transistor, and energy bandgap of said undoped semiconductor layer is smaller than energy difference between ground levels of said conduction band and said valence band of said quantum dots.

11. An optical memory device as claimed in claim 8, wherein a plurality of emitter electrodes are formed on said emitter layer of said bipolar transistor, and a collector electrode is formed on a collector layer of said bipolar transistor.

12. An optical memory device as claimed in claim 1, wherein said carrier barrier semiconductor layer constitutes an i layer of a pin junction type photodiode.

13. An optical memory device as claimed in claim 11, wherein said carrier barrier semiconductor layer is formed on a light emitting device.

14. An optical memory device as claimed in claim 1, wherein said quantum dots are so formed that a plurality of quantum dots are located in a thickness direction of said carrier barrier semiconductor layer.

15. An optical memory device as claimed in claim 14, wherein said plurality of quantum dots have respectively different diameters in said thickness direction.

16. An optical memory device as claimed in claim 14, further comprising a barrier layer for preventing drift of a carrier accumulated in said quantum dots when said quantum dots are in a hole burning state, said barrier layer being located on an opposite side of said quantum dots with respect to a carrier drift direction.

17. An optical memory device comprising:
- a first undoped compound semiconductor layer formed on a compound semiconductor substrate including first conductivity type impurities;
- a first quantum dot formed on said first undoped compound semiconductor layer;
- a second undoped compound semiconductor layer for covering said first undoped compound semiconductor layer and said first quantum dot;
- a first undoped energy barrier layer formed on said second compound semiconductor layer, said first undoped energy barrier layer having a wider energy bandgap than that of said first and second undoped compound semiconductor layers;
- a contact compound semiconductor layer including said second conductive type impurities, said contact semiconductor layer formed on or above said first undoped energy barrier layer; and
- backward bias voltage providing means which provide backward bias voltage between said contact compound semiconductor layer and said compound semiconductor substrate.

18. An optical memory device as claimed in claim 17, wherein said first undoped compound semiconductor layer and said second undoped compound semiconductor layer are formed with a same material having an energy bandgap which is identical to or wider than that of a constituent material of said compound semiconductor substrate.

19. An optical memory device as claimed in claim 17, further comprising, between said first undoped energy barrier layer and said contact compound semiconductor layer:
- a third undoped compound semiconductor layer formed on said first undoped energy barrier layer;
- a second quantum dot formed on said third undoped compound semiconductor layer;
- a fourth undoped compound semiconductor layer covering said second quantum dot and said third undoped compound semiconductor layer; and
- a second undoped energy barrier layer located on said fourth undoped compound semiconductor layer, said second energy barrier layer having a wider energy bandgap than that of said third and fourth undoped compound semiconductor layers.

20. An optical memory device as claimed in claim 19, wherein said third undoped compound semiconductor layer and said fourth undoped compound semiconductor layer are formed with a material having an energy bandgap which is identical to or wider than that of a constituent material of said compound semiconductor substrate.

21. An optical memory, device as claimed in claim 19, wherein plural multi-layer structures having said first undoped compound semiconductor layer and said first quantum dot and said second undoped compound semiconductor layer are formed on said compound semiconductor substrate.

22. An optical memory device as claimed in claim 19, further comprising a fifth compound semiconductor layer which is formed between said first undoped energy barrier layer and said second undoped energy barrier layer and said fourth undoped compound semiconductor layer, and said fifth compound semiconductor layer having an energy bandgap narrower than said fourth undoped compound semiconductor layer.

23. An optical memory device as claimed in claim 22, further comprising a pair of electrodes connected to said fifth compound semiconductor. layer.

24. An optical memory device as claimed in claim 19, further comprising:
- a compound semiconductor contact layer containing second conductivity type impurities is formed over said second compound semiconductor layer;
- an upper electrode formed on said compound semiconductor contact layer; and
- a lower electrode formed beneath said compound semiconductor substrate.

25. An optical memory device according to claim 1, wherein ground quantum levels of valence bands of said quantum dots are separated from a valence band edge of said first layer in respect of energy.

* * * * *